(12) United States Patent
Suzuki

(10) Patent No.: US 6,262,607 B1
(45) Date of Patent: Jul. 17, 2001

(54) OUTPUT BUFFER CIRCUIT

(75) Inventor: Yoshihide Suzuki, Tokyo (JP)

(73) Assignees: Mitsubishi Denki Kabushiki Kaisha; Mitsubishi Electric Engineering Co., Ltd., both of Tokyo (JP)

( * ) Notice: Subject to any disclaimer, the term of this patent is extended or adjusted under 35 U.S.C. 154(b) by 0 days.

(21) Appl. No.: 09/440,196

(22) Filed: Nov. 15, 1999

(30) Foreign Application Priority Data

Jul. 5, 1999 (JP) .................................................. 11-191046

(51) Int. Cl.[7] .............................. H03B 1/00; H03K 3/00
(52) U.S. Cl. ......................... 327/112; 327/170; 327/379
(58) Field of Search .................................... 327/108, 112, 327/170, 379, 384, 387, 389, 391; 326/26, 27, 29, 83, 86

(56) References Cited

U.S. PATENT DOCUMENTS

| | | | |
|---|---|---|---|
| 4,686,511 | * | 8/1987 | Koen ...................................... 340/347 |
| 5,430,389 | * | 7/1995 | Kamiya ................................... 326/27 |
| 5,517,140 | * | 5/1996 | Hatsuda .................................. 327/95 |
| 5,617,051 | * | 4/1997 | Bingham ............................... 327/317 |
| 5,963,047 | * | 10/1999 | Kwong et al. .......................... 326/27 |

FOREIGN PATENT DOCUMENTS

| | | |
|---|---|---|
| 4160920 | 6/1992 | (JP) . |
| 6112801 | 4/1994 | (JP) . |

* cited by examiner

*Primary Examiner*—Terry D. Cunningham
*Assistant Examiner*—Quan Tra
(74) *Attorney, Agent, or Firm*—Leydig, Voit & Mayer, Ltd.

(57) ABSTRACT

An output buffer circuit has a CMOS output circuit constituted by a p-channel MOS transistor and an n-channel MOS transistor. A combination circuit is provided between an input terminal of the output buffer circuit and the CMOS output circuit. This combination circuit temporarily decreases a signal output to a gate input terminal of the CMOS output circuit when the signal rises from a relatively low first potential level ("L" level) to a relatively high second potential level ("H" level) and temporarily raises the signal when the signal falls from the relatively high second potential level to the relatively low first potential level. Therefore, overshoot, undershoot, and ringing of an output signal can be prevented.

26 Claims, 16 Drawing Sheets

OUTPUT BUFFER CIRCUIT

FIELD OF THE INVENTION

The present invention relates to an output buffer circuit used in a semiconductor integrated circuit. More particularly, this invention relates to a CMOS output buffer circuit.

BACKGROUND OF THE INVENTION

In recent years, with an increase in speed of a digital signal processing, a high processing speed is also demanded in an output buffer circuit. As a conventional output buffer circuit, an output buffer circuit having a complementary metal oxide semiconductor (CMOS) configuration using a transistor having a high current drive capability for increasing processing speed is known. FIG. 14 is a circuit diagram showing a rough configuration of a conventional output buffer circuit. The conventional output buffer circuit comprises an inverter circuit 91 serving as a pre-driver and a final CMOS output circuit in which a p-channel MOS transistor QP0 having a high drive capability and an n-channel MOS transistor QN0 are connected in series with each other. A load capacitor CL is connected to the output terminal of the final CMOS output circuit extracted from the node between the p-channel MOS transistor QP0 and the n-channel MOS transistor QN0.

Operation of the conventional output buffer circuit will be described below. FIG. 15 is a timing chart showing the operation of the conventional output buffer circuit. In the operation of the conventional output buffer circuit, when an input signal Vin input to the inverter circuit 91 is at an "L" level, an output signal A0 from the inverter circuit 91 goes to an "H" level, the p-channel MOS transistor QP0 is turned OFF, and the n-channel MOS transistor QN0 is turned ON. In this manner, the load capacitor CL is in a discharge state, and an output signal Vout0 from the output buffer goes to an "L" level.

When the level of the input signal Vin changes from an "L" level to an "H" level, the level of the output signal A0 from the inverter circuit 91 changes from an "H" level to an "L" level, the p-channel MOS transistor QP0 is turned ON, and the n-channel MOS transistor QN0 is turned OFF. In this manner, the load capacitor CL is charged, and the output signal Vout0 goes to an "H" level. In addition, the level of the input signal Vin changes from an "H" level to an "L" level again, the level of the output signal A0 from the inverter circuit 91 changes from an "L" level to an "H" level, the p-channel MOS transistor QP0 is turned OFF, and the n-channel MOS transistor QN0 is turned ON. In this manner, electric charges charged in the load capacitor CL are discharged, and the output signal Vout0 goes to an "L" level.

In order to increase the processing speed of the output buffer circuit, the current drive capabilities of the p-channel MOS transistor QP0 and the n-channel MOS transistor QN0 serving as output transistors are made high. In this case, when the load capacitor CL is large, the inductances of the load capacitor CL and a wire or the like resonate. When the output signal Vout0 rises or drops, overshoot, undershoot, and ringing occur. The principle behind the occurrence of ringing and the like occur will be described below with reference to FIG. 16. FIG. 16 is a circuit diagram showing a rough equivalent circuit of the conventional output buffer circuit in a state wherein a signal having an "L" level is output, i.e., the n-channel MOS transistor QN0 is turned ON.

In the equivalent circuit of the conventional output buffer circuit, the n-channel MOS transistor QN0 is represented by a circuit in which a current source 92 and an ON resistor Ron are connected in parallel to each other. A load connected to an output terminal 93 of the output buffer circuit is expressed by a circuit obtained such that an inductance 94 constituted by a wire, a pattern on a printed board, a bonding wire of an integrated circuit, or the like is connected in series with a load capacitor 95. In this manner, an equivalent circuit including the output buffer circuit and the load constitutes an LCR resonance circuit. A resonance frequency f0 of the LCR resonance circuit and a value θ obtained at the resonance frequency are expressed by the following equations:

$$f0 = 1/(2\pi \cdot SQRT(LC))$$

$$\theta = j\omega 0 \cdot L/Ron$$

where $2\pi f0 = \omega 0$, and SQRT(X) represents the square root of X.

In this case, as the current drive capability of the output transistor is increased to increase the processing speed of the output buffer circuit, the ON resistor Ron of the output transistor decreases. Accordingly, the value θ increases and the output buffer circuit resonates due to a change in level of the input signal Vin0 from an "H" level to an "L" level, so that ringing or the like of the output signal Vout0 occurs.

However, according to the prior art described above, when the current drive capability of the output transistor is excessively increased to increase the processing speed of the output buffer circuit, overshoot, undershoot, and ringing occur when the output signal Vout0 rises or drops. The overshoot, undershoot, and ringing may generate noise in signal transmission, and may cause an erroneous operation of a logic circuit system. In addition, the overshoot, undershoot, and ringing may be a factor called an undesired reflection which generates jamming waves to another electronic equipment. Thus, an increase in current drive capability of the output transistor is limited to a specific level, and a desired high-speed operation cannot be performed.

SUMMARY OF THE INVENTION

The present invention has been made in consideration of the above circumstances. It is an object of this invention to obtain a high-speed output buffer circuit which reduces overshoot, undershoot, and ringing of an output signal to prevent an erroneous operation and has a high drive capability.

According to a first aspect of the present invention, a correction unit decrease a signal output by an output unit when the signal rises from a relatively low first potential level ("L" level) to a relatively high second potential level ("H" level), and temporarily raises the signal when the signal falls from the relatively high second potential level to the relatively low first potential level. In this manner, when the output signal rises, a voltage applied to the gate of the output unit is temporarily increased immediately before overshoot occurs and hence the output signal can be suppressed from rising. When the output signal falls, a voltage applied to the gate of the output unit is temporarily decreased immediately before undershoot occurs and hence the output signal can be suppressed from falling.

According to second aspect of the present invention, a correction unit temporarily gives a reverse bias to suppress an output signal of the output buffer circuit from rising when a signal output by an output unit rises from a relatively low first potential level to a relatively high second potential level, and temporarily gives a reverse bias to suppress the output signal of the output buffer circuit from falling when the signal output by the output unit falls from the relatively high second potential level to the relatively low first potential level. In this manner, when the output signal rises, the output signal can be temporarily suppressed from rising immediately before overshoot occurs. When the output signal falls, the output signal can be temporarily suppressed from falling immediately before undershoot occurs.

In the invention according to first and second aspects of the present invention, the timing at which the signal output by the output unit is temporarily decreased or raised or the timing at which the output signal of the output buffer circuit is suppressed from rising or falling is adjusted by a first adjustment unit. Therefore, the signal output by the output unit can be temporarily controlled to decrease or raise, or the output signal of the output buffer circuit can be suppressed from falling or rising at an appropriate timing depending upon the characteristics (capacitance and the like) of a connected load.

According to the third aspect of the present invention, a correction unit temporarily raises or decreases the signal output by an output unit at the timing depending upon rising or falling of the output signal of the output unit. In this manner, when the output signal rises, a voltage applied to the gate of the output unit is temporarily increased immediately before overshoot occurs and hence the output signal can be suppressed from rising. When the output signal falls, the voltage applied to the gate of the output unit is temporarily dropped immediately before undershoot occurs and hence the output signal can be suppressed from falling. In addition, even if a timing is not set, the signal can be temporarily decreased or raised at an appropriate timing depending upon the characteristics of a connected load.

In the invention according to the first to third aspects of the present invention, the length of the period of time for which a signal output by the output unit is temporarily decreased or raised or the length of the period of time for which the output signal of the output buffer circuit is suppressed from rising or falling is adjusted by a second adjustment unit, so that the signal can be temporarily kept fallen or raised for an appropriate time depending upon the characteristics of a load to be connected.

Other objects and features of this invention will become apparent from the following description with reference to the accompanying drawings.

DESCRIPTION OF THE PREFERRED EMBODIMENTS

Embodiments of an output buffer circuit according to the present invention will be described below with reference to the accompanying drawings. The present invention is not limited to the embodiments.

Figure 1:
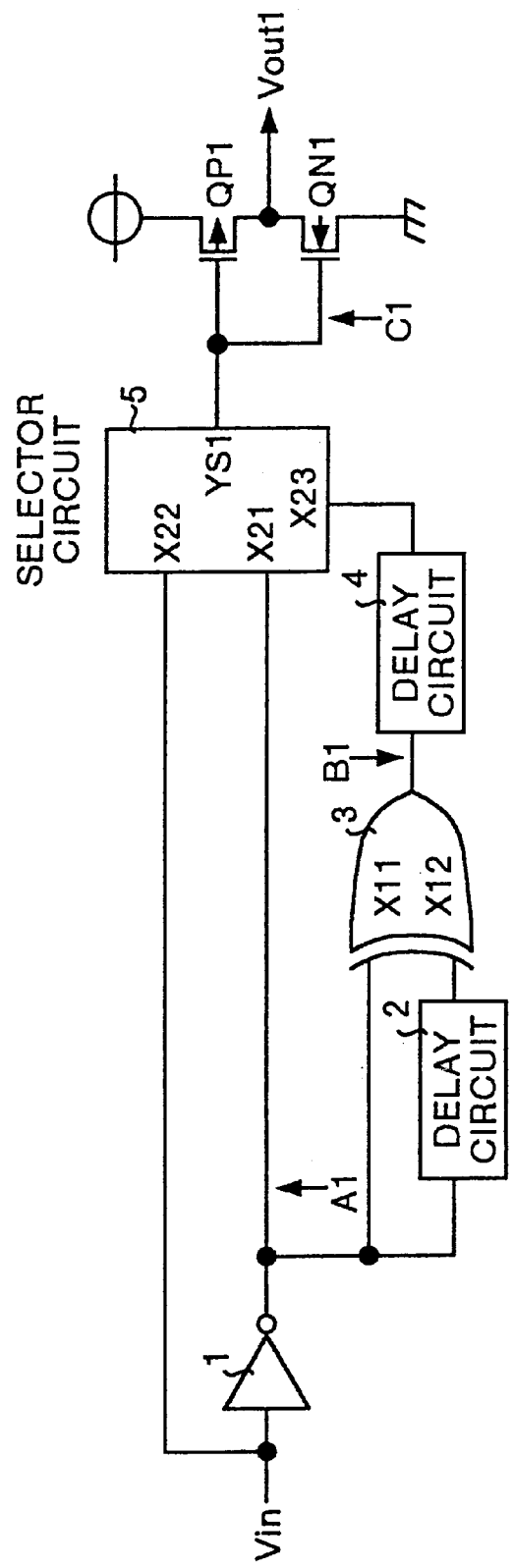
FIG. 1 is a circuit diagram showing the rough configuration of an output buffer circuit according to the first embodiment of the present invention;.

FIG. 1 is a circuit diagram showing the rough configuration of an output buffer circuit according to a first embodiment of the present invention. The output buffer circuit according to the first embodiment comprises an inverter circuit 1 which receives an input signal Vin from the outside of the output buffer circuit to output an inverted signal, a delay circuit 2 which receives an output signal A1 from the inverter circuit 1 to output a delayed signal, an EXOR circuit 3 which receives the output signal A1 from the inverter circuit 1 and an output signal from the delay circuit 2 to perform a logical operation of exclusive OR, a delay circuit 4 which receives an output signal from the EXOR circuit 3 to output a delayed signal, a selector circuit 5 which receives the input signal Vin, the output signal A1 from the inverter circuit 1, and an output signal from the delay circuit 4 to selectively output the input signal Vin or the output signal A1 from the inverter circuit 1 depending upon a logical level ("H" level or "L" level) of the output signal from the delay circuit 4, and a final CMOS output circuit which uses an output signal C1 from the selector circuit 5 as a gate input.

The final CMOS output circuit is constituted by a p-channel MOS transistor QP1 and an n-channel MOS transistor QN1 which are arranged in series with each other between a power supply and the ground and have high drive capabilities, and an output signal Vout1 of the output buffer circuit is output from a node between the transistor QP1 and the transistor QN1. The EXOR circuit 3 receives the output signal A1 from one input terminal X11 and receives an output signal of the delay circuit 2 from the other input terminal X12 to perform a logical operation of exclusive OR.

When the logical level of the input signal Vin does not change, the logical level of the signal A1 does not change too, and the logical level of the output signal of the delay circuit 2 does not change too. Thus, the logical level of the signal A1 and the logical level of the output signal of the delay circuit 2 are equal to each other, and the EXOR circuit 3 outputs a signal at an "L" level. On the other hand, when the logical level of the input signal Vin changes, the logical level of the output signal A1 changes, and the logical level of the output signal of the delay circuit 2 also changes a predetermined period of delay time after.

In a period of time after the logical level of the output signal A1 changes until a delay time obtained by the delay circuit 2 elapses, the logical level of the output signal A1 and the logical level of the output signal of the delay circuit 2 are different from each other. Therefore, the EXOR circuit 3 outputs a signal at an "H" level. More specifically, the logical level of the input signal Vin changes, the EXOR circuit 3 outputs a pulse signal whose logical level changes in the order named: "L", "H", and "L" levels. The pulse signal output from the EXOR circuit 3 is delayed by the delay circuit 4 and then input to the selector circuit 5.

Figure 2:
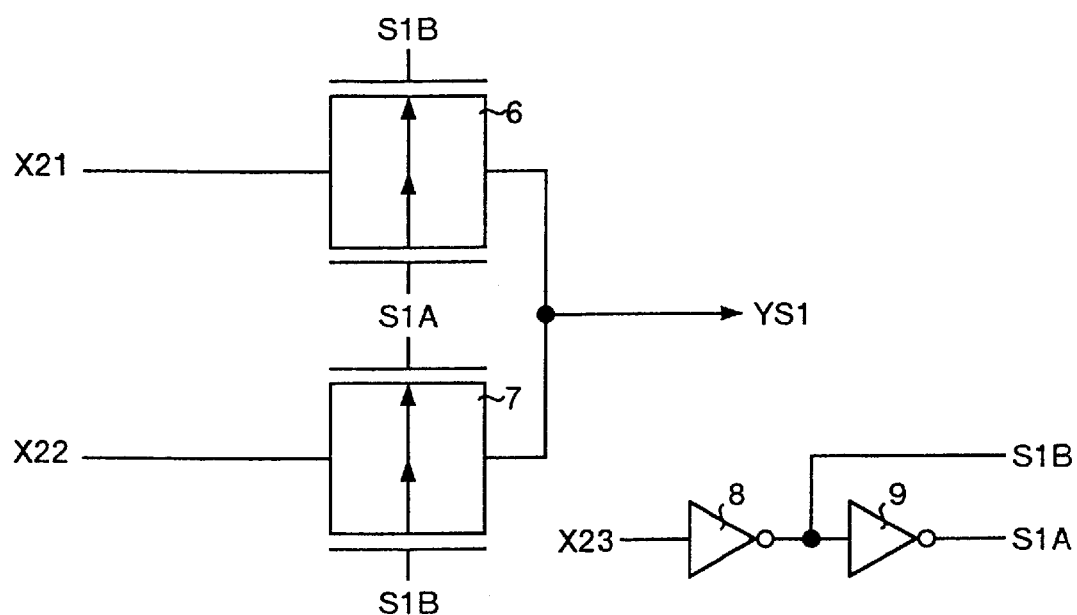
FIG. 2 is a circuit diagram showing the configuration of a selector circuit according to a first embodiment shown in FIG. 1.

FIG. 2 is a circuit diagram showing the configuration of the selector circuit 5 shown in FIG. 1. The selector circuit 5 comprises inverter circuits 8 and 9 and switches 6 and 7. The inverter circuits 8 and 9 output a signal S1A having a logical level equal to that of an output signal of the delay circuit 4 and input from an input terminal X23 and a signal S1B having a logical level reverse to that of the output signal and input from the input terminal X23, respectively. The switches 6 and 7 are turned ON/OFF depending upon the logical levels of the signals S1A and S1B to connect one of input terminals X21 and X22 to an output terminal YS1. In this manner, when the output signal of the delay circuit 4 is at an "H" level, the input terminal X22 is selected to output the input signal Vin. When the output signal of the delay circuit 4 is at an "L" level, the input terminal X21 is selected to output the output signal A1.

Figure 3:
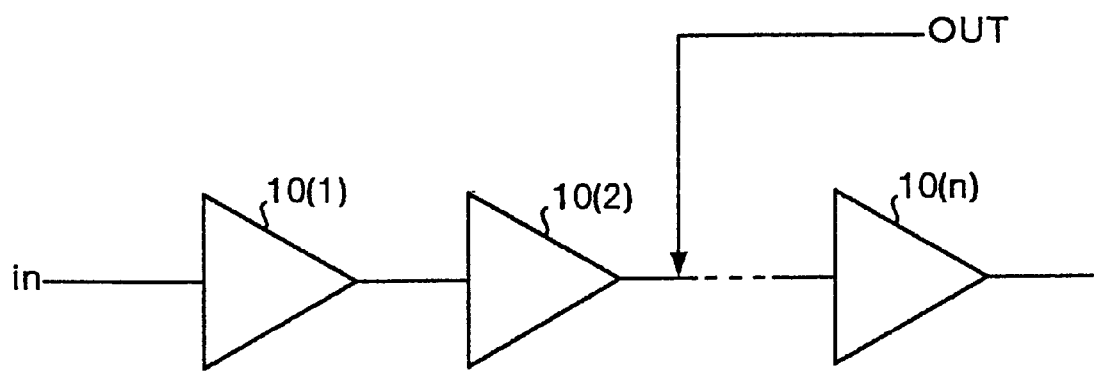
FIG. 3 is a circuit diagram showing the configuration of a delay circuit according to the first embodiment shown in FIG. 1.

FIG. 3 is a circuit diagram showing of the configuration of the delay circuits 2 and 4 shown in FIG. 1. The delay circuits 2 and 4 have a plurality of delay circuits 10 (1), 10 (2), . . . 10 (n). The amount of delay can be adjusted by changing the number "n" of delay circuits to be used. In this manner, a pulse signal output to the input terminal X23 of the selector circuit 5 can be adjusted. More specifically, by adjusting the amount of delay of the delay circuit 2, the period of time for which the pulse signal represents an "H" level can be adjusted. By adjusting the amount of delay of the delay circuit 4, a time after the logical level of the input signal Vin changes until the pulse signal represents an "H" level can be adjusted.

The final CMOS output circuit constituted by the p-channel MOS transistor QP1 and the n-channel MOS transistor QN1 corresponds to the output unit according to the present invention. The combination circuit constituted by the delay circuit 2, the EXOR circuit 3, the delay circuit 4, and the selector circuit 5 corresponds to the correction unit according to the present invention. The delay circuit 4 corresponds to the first adjustment unit according to the present invention, and the delay circuit 2 corresponds to the second adjustment unit according to the present invention.

Figure 4:
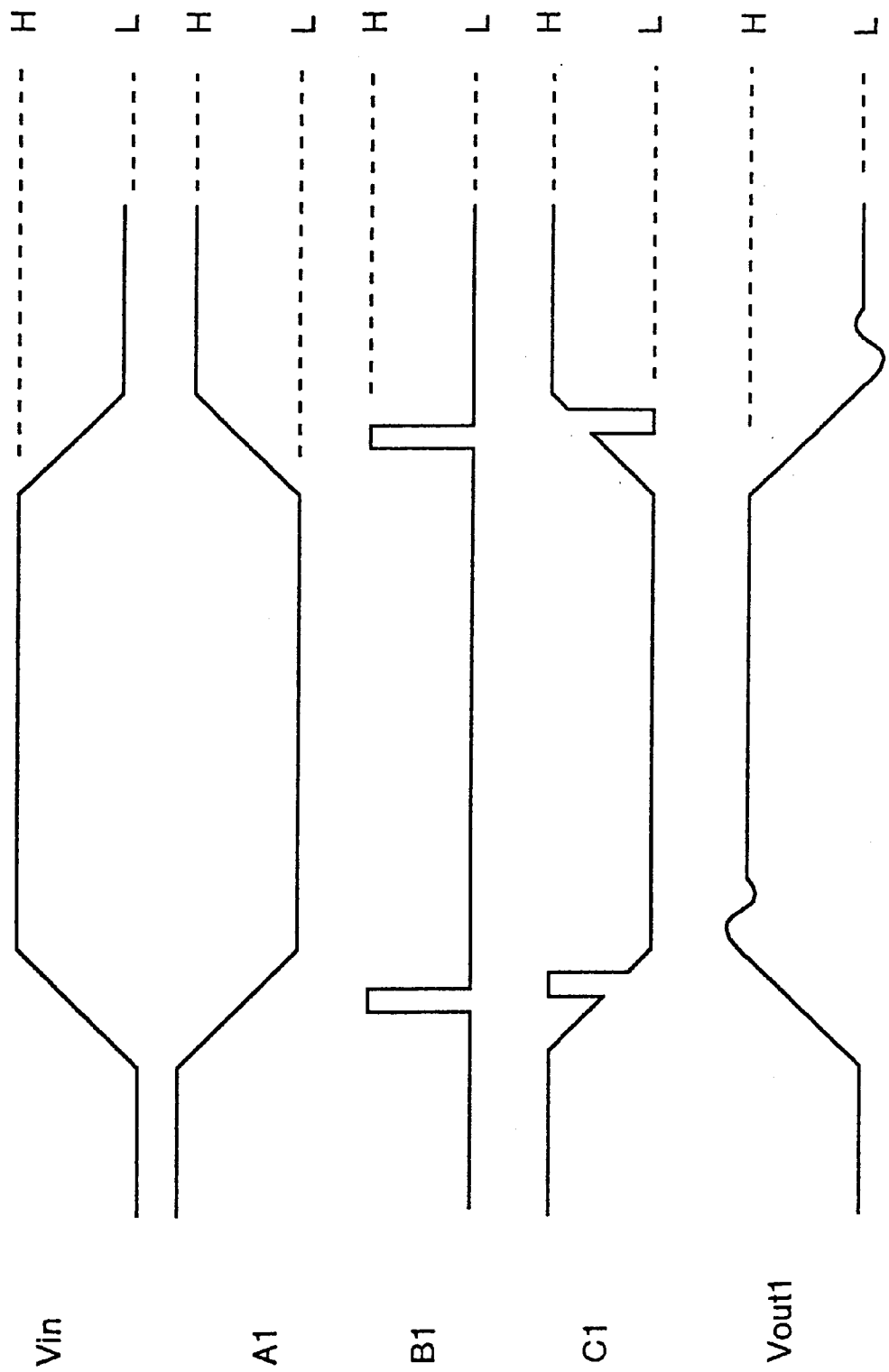
FIG. 4 is a timing chart showing an operation of the output buffer circuit according to the first embodiment.

In the configuration described above, an operation of the first embodiment will be described below with reference to a timing chart. FIG. 4 is a timing chart showing an operation of an output buffer circuit according to the first embodiment. In the operation of the output buffer circuit according to the first embodiment, when the input signal Vin is stable at an "L" level for a sufficient time equal to or longer than a time obtained by adding the delay time obtained by the delay circuit 2 to the delay time obtained by the delay circuit 4, the output signal A1 of the inverter circuit 1 goes to an "H" level, an output signal B1 of the EXOR circuit 3 goes to an "L" level, and the output signal of the delay circuit 4 also goes to an "L" level.

Since the output signal of the delay circuit 4 is at the "L" level, the selector circuit 5 selects the signal A1, and the output signal C1 of the selector circuit 5 goes to an "H" level. In this manner, the transistor QP1 is turned OFF, and the transistor QN1 is turned ON. A not shown load capacitor connected to the output terminal of the output buffer is set in a discharge state, and the output signal Vout1 of the output buffer circuit goes to an "L" level.

When the input signal Vin rises, i.e., when the level of the input signal Vin changes from an "L" level to an "H" level, the output signal A1 of the inverter circuit 1 changes from an "H" level to an "L" level. As described above, the pulse signal whose logical level changes in the order named: "L", "H", and "L" levels is output from the EXOR circuit 3, delayed by the delay circuit 4, and then input to the selector circuit 5. The selector circuit 5 selects and outputs the output signal A1. However, the input signal Vin having a logical level reverse to the logical level of the output signal A1 is selected and output in only the period of time for which the pulse signal input from the input terminal X23 is kept at an "H" level. More specifically, the output signal C1 of the selector circuit 5 is switched in the order named: "signal A1", "input signal Vin", and "signal A1".

When the selector circuit 5 selects the output signal A1 before the input signal Vin is selected, the output signal A1 goes to an "L" level to turn ON the transistor QP1 and to turn OFF the transistor QN1. Charging to the not shown load capacitor is started, and the level of the output signal Vout1 rises. After a delay operation performed by the delay circuit 4, a pulse signal input to the selector circuit 5 goes to an "H" level, and the selector circuit 5 selects the input signal Vin having the "H" level. In this manner, the transistor QP1 is turned OFF, and the transistor QN1 is turned ON, charging to the load capacitor or a current flowing in inductance components such as a wire, a pattern on a printed board, and a bonding wire of an integrated circuit is temporarily interrupted.

This interruption continues in the period of time for which the pulse signal input to the selector circuit 5 is kept at the "H" level, i.e., for a delay time obtained by the delay circuit 2. In this manner, overshoot and ringing can be suppressed. After the delay time obtained by the delay circuit 2 elapses, the pulse signal input to the selector circuit 5 goes to the "L" level again. When the selector circuit 5 selects the output signal A1 set at the "L" level again, the transistor QP1 is turned ON, and the transistor QN1 is turned OFF. The load capacitor is charged and the output signal Vout1 goes to an "H" level.

In addition, when the input signal Vin falls, i.e., when the level of the input signal Vin changes from an "H" level to an "L" level, the level of the output signal A1 of the inverter circuit 1 changes from an "L" level to and an "H" level. As described above, the pulse signal whose logical level changes in the order named: "L", "H", and "L" levels is output from the EXOR circuit 3, delayed by the delay circuit 4, and then input to the selector circuit 5. The selector circuit 5 selects and outputs the output signal A1. However, the input signal Vin having a logical level reverse to the logical level of the output signal A1 is selected and output in only the period of time for which the pulse signal input from the input terminal X23 is kept at an "H" level. More specifically, the output signal C1 of the selector circuit 5 is switched in the order named: "signal A1", "input signal Vin", and "signal A1".

When the selector circuit 5 selects the output signal A1 before the input signal Vin is selected, the output signal A1 goes to an "H" level to turn OFF the transistor QP1 and to turn ON the transistor QN1. Charging to the load capacitor is started, and the level of the output signal Vout1 falls. After a delay operation performed by the delay circuit 4, a pulse signal input to the selector circuit 5 goes to an "H" level, and the selector circuit 5 selects the input signal Vin having the "L" level. In this manner, the transistor QP1 is turned ON, and the transistor QN1 is turned OFF, charging to the load capacitor or a current flowing in inductance components such as a wire, a pattern on a printed board, and a bonding wire of an integrated circuit is temporarily interrupted.

This interruption continues in the period of time for which the pulse signal input to the selector circuit 5 is kept at the "H" level, i.e., for a delay time obtained by the delay circuit 2. In this manner, undershoot and ringing can be suppressed. After the delay time obtained by the delay circuit 2 elapses, the pulse signal input to the selector circuit 5 goes to the "L" level again. When the selector circuit 5 selects the output signal A1 set at the "H" level again, the transistor QP1 is turned OFF, and the transistor QN1 is turned ON. The load capacitor is in a discharge state, and the output signal Vout1 goes to an "L" level.

As described above, according to the first embodiment, immediately before the output signal Vout1 of the final CMOS output circuit is overshot, a voltage applied to the gate electrode of the final CMOS output circuit is temporarily increased to suppress the output signal Vout1 from rising. Further, immediately before the output signal Vout1 is undershot, the voltage applied to the gate electrode of the final CMOS output circuit is temporarily dropped to suppress the output signal Vout1 from falling. Thus, overshoot, undershoot, and ringing of the output signal can be reduced to prevent an erroneous operation, and the drive capability of the output buffer circuit can be improved to increase a processing speed.

The amounts of delay of the delay circuits 2 and 4 can be changed. When the amounts of delay of the delay circuits 2 and 4 are adjusted, the timing at which the voltage applied to the gate electrode of the output circuit is temporarily increased or dropped and the length of the period of time for which the voltage is temporarily increased or dropped can be adjusted depending upon the characteristics (capacitance or the like) of the load connected to the output terminal of the output buffer circuit. Thus, an output buffer circuit need not be prepared for each of the characteristics of the load, and costs can be reduced. A delay time obtained by the combination circuit constituted by the delay circuit 2, the EXOR circuit 3, the delay circuit 4, and the selector circuit 5 for reducing overshoot, undershoot, and ringing is sufficiently short. The delay time is appropriate to a high-speed operation of the output buffer circuit.

Figure 5:
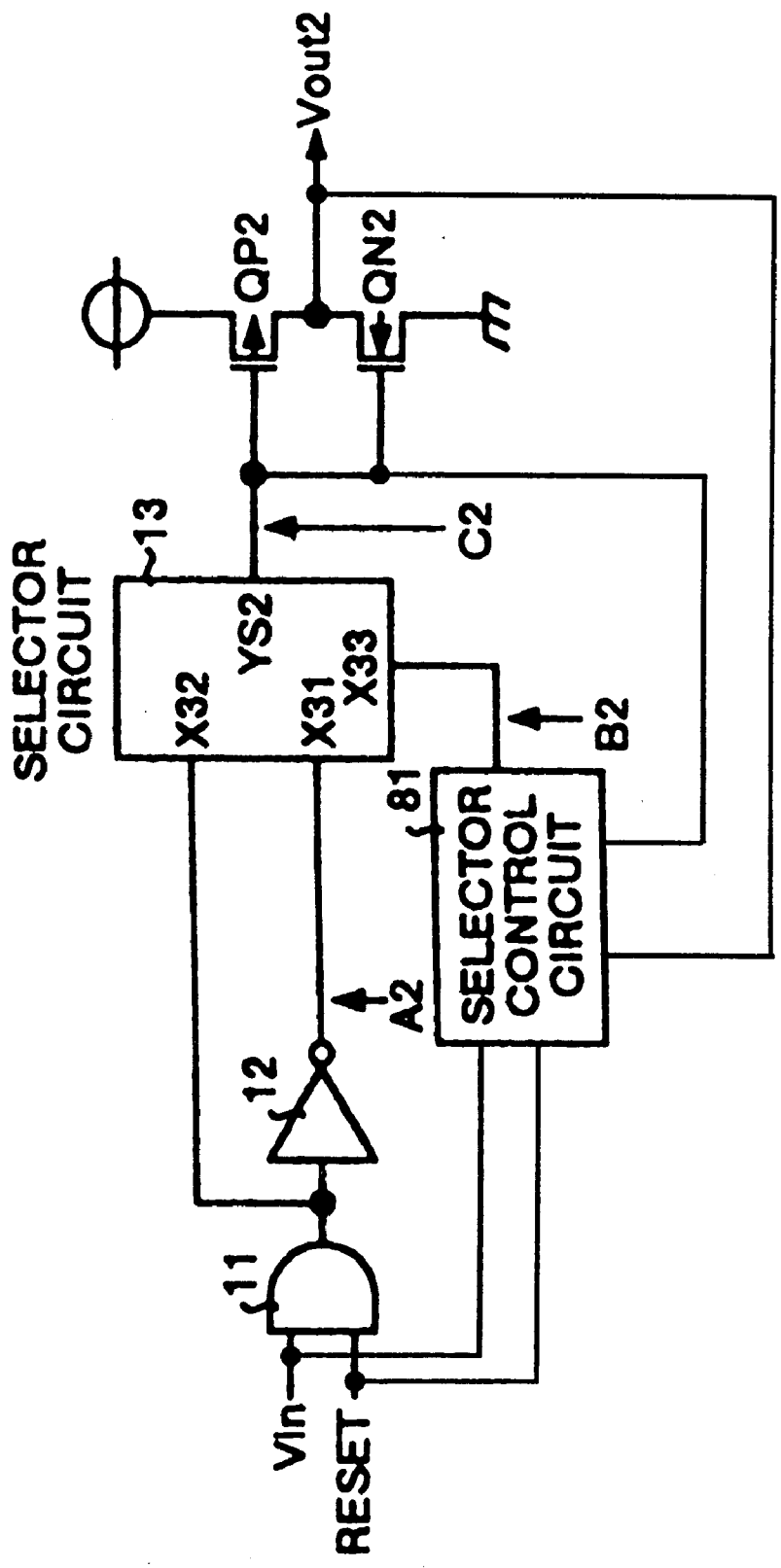
FIG. 5 is a circuit diagram showing the rough configuration of an output buffer circuit according to a second embodiment of the present invention.

FIG. 5 is a circuit diagram showing the rough configuration of an output buffer circuit according to a second embodiment of the present invention. The output buffer circuit according to the second embodiment comprises an AND circuit 11 which receives an input signal Vin and a reset signal from the outside of the output buffer circuit, an inverter circuit 12 which receives an output signal of the AND circuit 11 and inverts the output signal to output the inverted signal, a selector control circuit 81, a selector circuit 13 which receives an output signal of the AND circuit 11 and an output signal A2 of the inverter circuit 12 to perform selection depending upon the logical level of an output signal B2 of the selector control circuit 81, and a final CMOS output circuit which uses an output signal C2 of the selector circuit 13 as a gate input.

The final CMOS output circuit is constituted by a p-channel MOS transistor QP2 and an n-channel MOS transistor QN2 which are arranged in series with each other between a power supply and the ground and have high drive capabilities, and an output signal Vout2 of the output buffer circuit is output from a node between the transistor QP2 and the transistor QN2.

Figure 6:
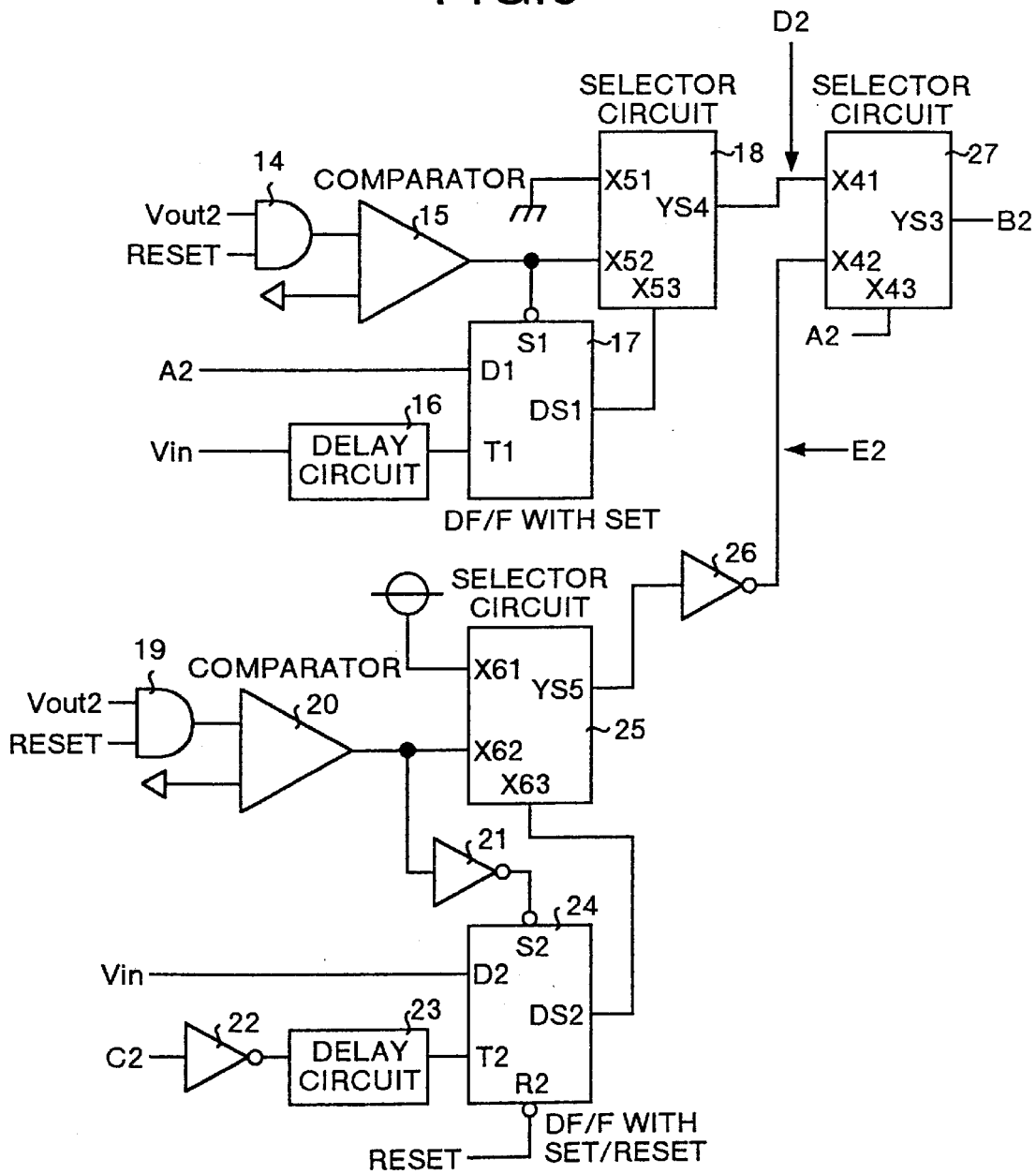
FIG. 6 is a circuit diagram showing the rough configuration of a selector control circuit according to the second embodiment shown in FIG. 5.

FIG. 6 is a circuit diagram showing the rough configuration of the selector control circuit 81 shown in FIG. 5. The selector control circuit 81 comprises an AND circuit 14 which receives the output signal Vout2 and the reset signal and performs an operation of logical AND, a comparator 15 which receives an output signal of the AND circuit 14 and performs comparison with reference to ½ of a VDD potential, a delay circuit 16 which receives the input signal Vin and delays the input signal Vin to output the delayed signal, a D flip-flop with SET (to be referred to as a DF/F with SET hereinafter) 17 which receives an output signal of the delay circuit 16 from an input terminal T1, receives a signal A2 from an input terminal d1, and receives an output signal of the comparator 15 from an input terminal S1, and a selector circuit 18 which has a grounded input terminal X51, receives an output signal of the comparator 15 from an input terminal X52, and performs selection depending upon the logical level of an output signal of the DF/F with SET.

The selector control circuit 81 further has an AND circuit 19 which receives the output signal Vout2 and the reset signal and performs an operation of logical AND, a comparator 20 which receives an output signal of the AND circuit 19 and performs comparison with reference to ½ of a VDD potential, an inverter circuit 21 which receives an output signal of the comparator 20 and inverts the output signal to output the inverted signal, an inverter circuit 22 which receives the signal C2 and inverts the signal C2 to output the inverted signal, a delay circuit 23 which receives an output signal of the inverter circuit 22 and delays the output signal to output the delayed signal, a D flip-flop with SET/RESET (to be referred to as a DF/F with SET/RESET hereinafter) 24 which receives a reset signal from an input terminal R2, receives an output signal of the delay circuit 23 from an input terminal T2, receives the input signal Vin from an input terminal D2, and receives an output signal of the inverter circuit 21 from an input terminal S2, a selector circuit 25 which has an input terminal X61 connected to a power supply, receives an output signal of the comparator 20 from an input terminal X62, and performs selection depending upon an output signal of the D flip-flop with SET/RESET 24, an inverter circuit 26 which receives an output signal of the selector circuit 25 and inverts the output signal to output the inverted signal, and a selector circuit 27 which receives the output signal D2 of the selector circuit 18 and an output signal E2 of the inverter circuit 26, performs selection depending upon the output signal A2, and outputs an output signal B2.

Figure 7:
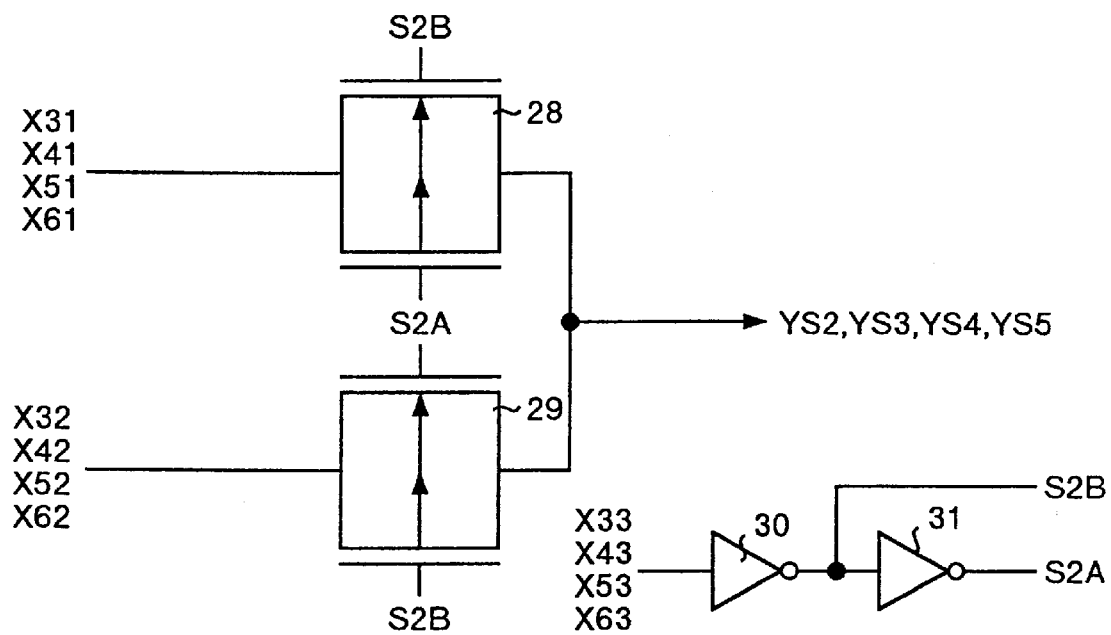
FIG. 7 is a circuit diagram showing the configuration of a selector circuit according to the second embodiment shown in FIGS. 5 and 6.

All the selector circuits 13, 18, 25, and 27 have the same configurations. FIG. 7 is a circuit diagram showing the configuration of any of the selector circuits 13, 18, 25, and 27 shown in FIGS. 5 and 6. Each of the selector circuits 13, 18, 25, and 27 comprise inverter circuits 30 and 31 and switches 28 and 29. The inverter circuits 30 and 31 output a signal S2A having the same logical level as that of signals input from input terminals X33, X43, X53, and X63 and a signal S2B having a logical level reverse to that of the signals input from the input terminals X33, X43, X53, and X63. The switches 28 and 29 are turned ON or OFF depending upon the logical levels of the signals S2A and S2B to connect one of a group consisting of input terminals X31, X41, X51, and X61 and a group consisting of input terminals X32, X42, X52, and X62 to output terminals YS2, YS3, YS4, and YS5.

Figure 8:
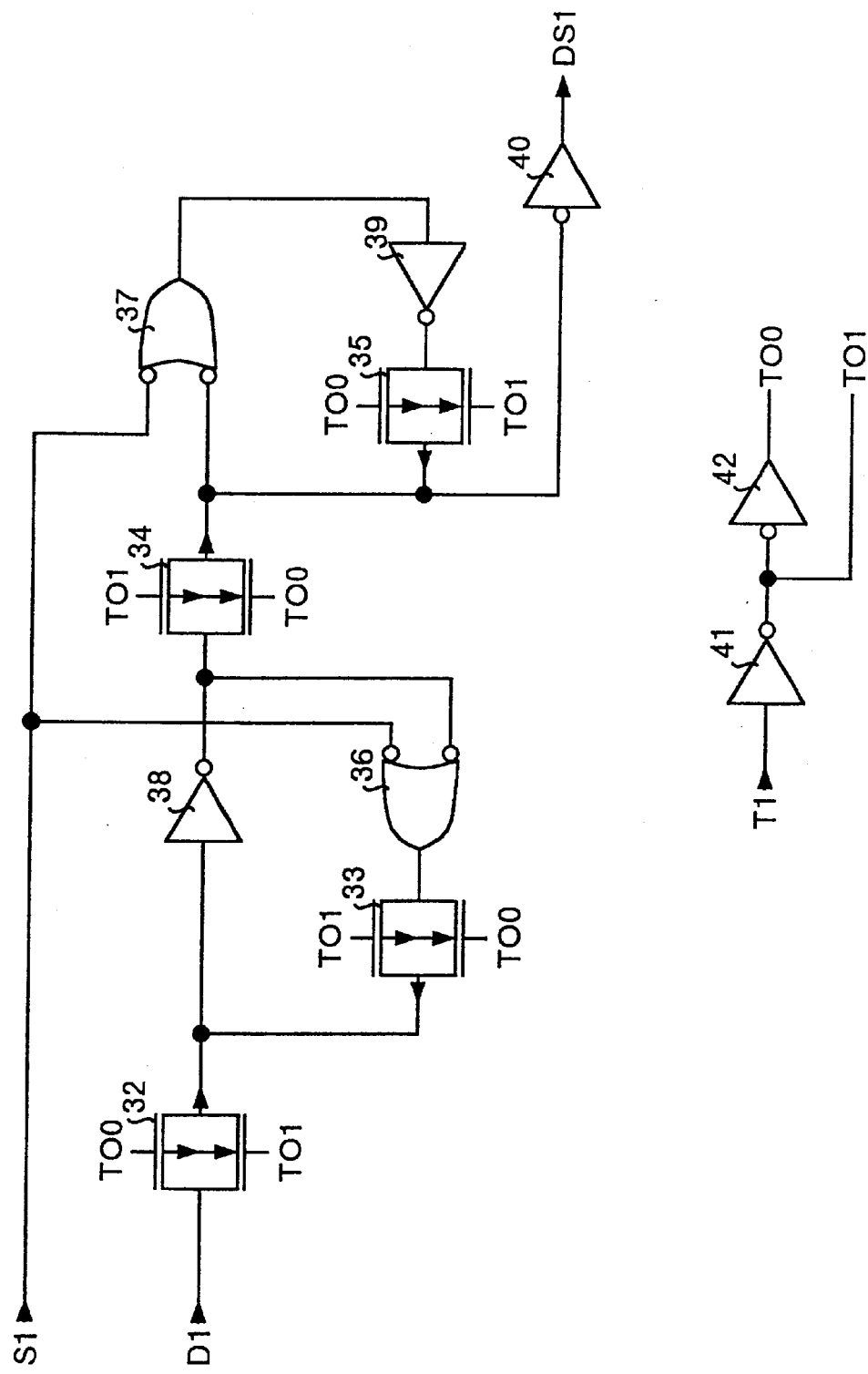
FIG. 8 is a circuit diagram showing the configuration of a DF/F with SET according to the second embodiment shown in FIG. 6.
Figure 9:
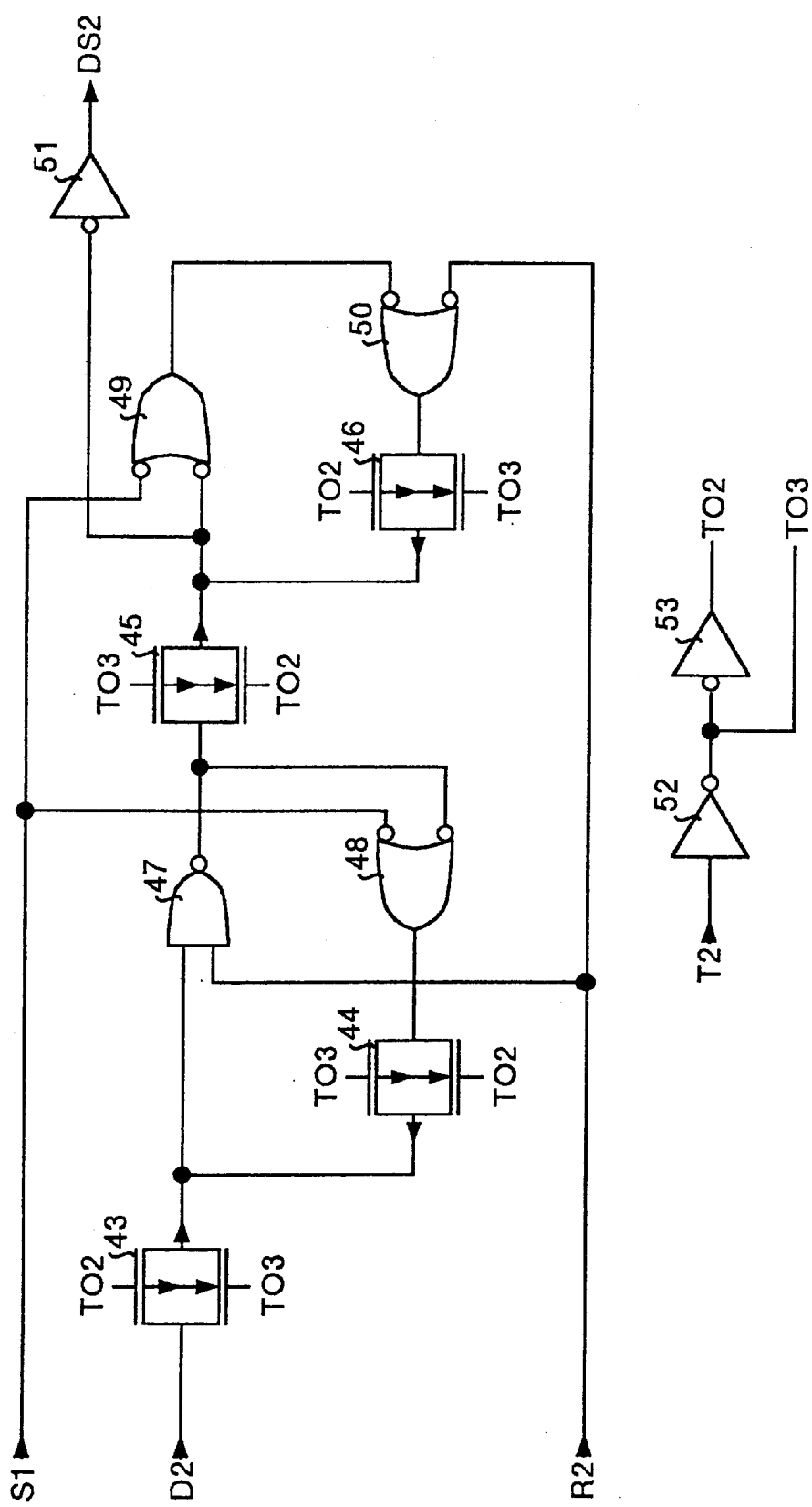
FIG. 9 is a circuit diagram showing the configuration of a DF/F with SET/RESET according to the second embodiment shown in FIG. 6.

FIG. 8 is a circuit diagram showing the configuration of the DF/F with SET 17 shown in FIG. 6, and FIG. 9 is a circuit diagram showing the configuration of the DF/F with SET/RESET 24 shown in FIG. 6. The DF/F with SET 17 has a circuit constituted by switches 32, 33, 34, and 35, NAND circuits 36 and 37, and inverter circuits 38, 39, 40, 41, and 42. The DF/F with SET/RESET 24 has a circuit constituted by switches 43, 44, 45, and 46, NAND circuits 47, 48, 49, and 50, and inverter circuits 51, 52, and 53.

Each of the delay circuits 16 and 23 has the same configuration as that of the delay circuit according to the first embodiment shown in FIG. 3, and has a variable amount of delay. The combination circuit constituted by the AND circuit 11, the selector circuit 13, and the selector control circuit 81 corresponds to the correction unit according to the present invention, and the delay circuits 16 and 23 correspond to the second adjustment unit according to the present invention.

Figure 10:
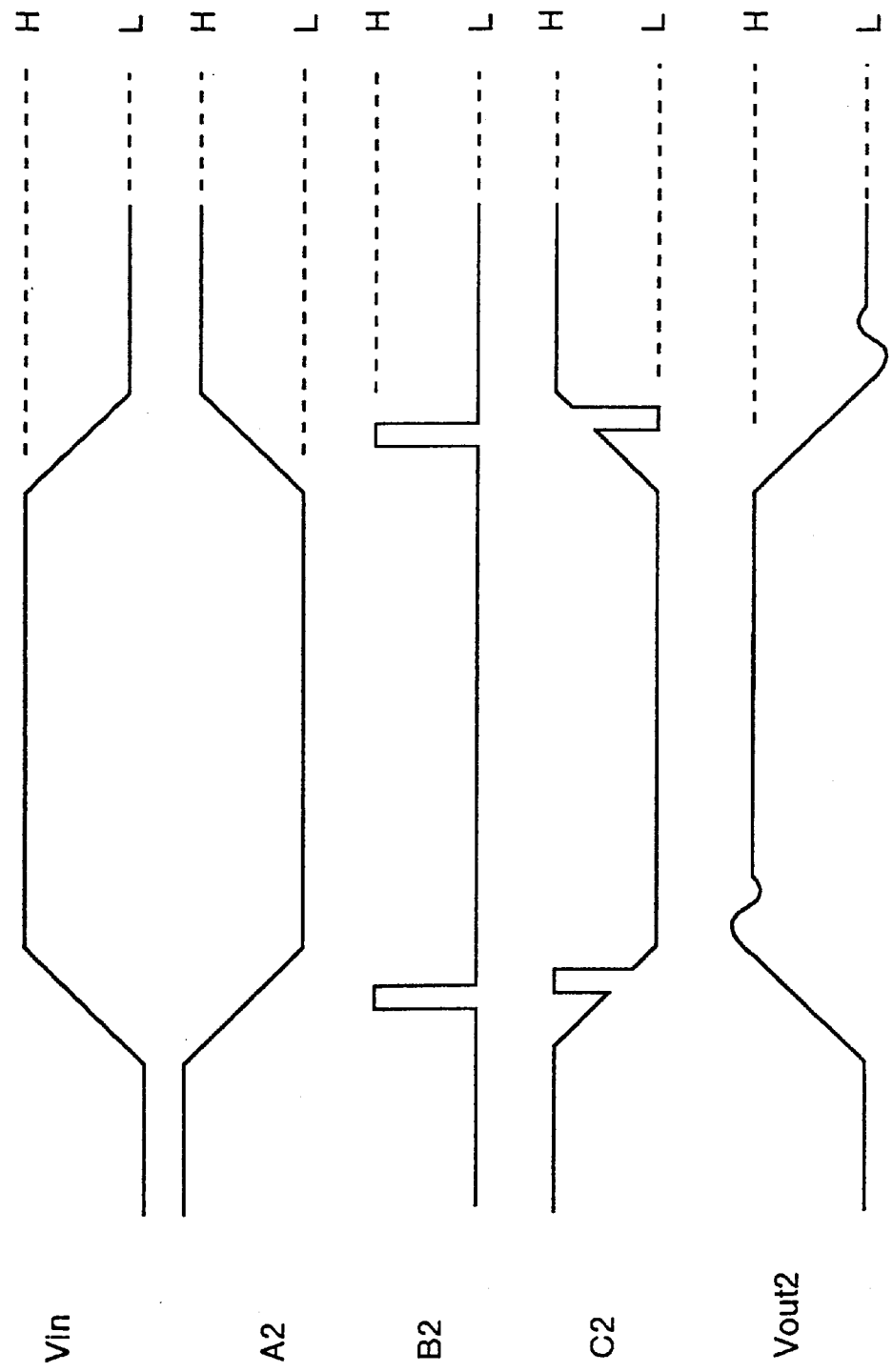
FIG. 10 is a timing chart showing an operation of the output buffer circuit according to the second embodiment.

An operation of the second embodiment will be described below with reference to a timing chart. FIG. 10 is a timing chart showing the operation of the output buffer circuit according to the second embodiment. In the operation of the output buffer circuit according to the second embodiment, an initial state is a reset state wherein the RESET signal is at an "L" level. After the RESET signal goes to an "H" level to release the reset state, the operation is started. If the input signal Vin is at an "L" level, output signals of the AND circuits 11, 14, and 19 go to "L" levels too, and the output signal A2 of the inverter circuit 12 goes to an "H" level.

Since the signal A2 is at the "H" level, the selector 27 selects an input from the input terminal X42, i.e., the output signal E2 of the inverter circuit 26. Since the output signal of the AND circuit 19 is at the "L" level, the output signal of the comparator 20 goes to an "L" level, the output signal of the inverter circuit 21 goes to an "H" level, and the output signal of the DF/F with SET/RESET 24 goes to an "L" level. Since the output signal of the DF/F with SET/RESET 24 is at the "L" level, the selector circuit 25 selects an input from the input terminal X61, i.e., the signal set at the "H" level of the power supply to output the signal.

The inverter circuit 26 receives the output signal of the selector circuit 25 and outputs the output signal E2 having an "L" level. Since the selector circuit 27 selects the signal E2, the signal B2 goes to an "L" level. Since the signal B2 is at the "L" level, the selector circuit 13 selects the output signal A2, and the output signal C2 of the selector circuit 13 goes to an "H" level. In this manner, the transistor QP2 is turned OFF, and the transistor QN2 is turned ON. A not shown load capacitor connected to the output terminal of the output buffer circuit is set in a discharge state, and the output signal Vout2 of the output buffer circuit goes to an "L" level.

When the input signal Vin rises, i.e., the level of the input signal Vin changes from an "L" level to an "H" level, the levels of the output signal A2 and the output signal C2 of the inverter circuit 12 change from "H" levels to "L" levels. In this manner, the transistor QP2 is turned ON, the transistor QN2 is turned OFF. Charging to the load capacitor is started, and the output signal Vout2 begins to change from an "L" level to an "H" level. Since the level of the signal A2 changes to the "L" level, the selector circuit 27 selects the output signal D2 of the selector circuit 18. The output signal of the DF/F with SET 17 in an initial state is at the "H" level, and the selector circuit 18 selects an input from the input terminal X52, i.e., an output signal of the comparator 15.

When the output signal Vout2 is equal to or higher than ½ VDD, the level of the output of the comparator 15 changes from an "L" level to an "H" level. Therefore, the level of the output signal D2 of the selector circuit 18 changes from an "L" level to an "H" level, and the level of the output signal B2 changes from an "L" level to an "H" level. Since the level of the signal B2 changes to the "H" level, the selector circuit 13 selects an output signal of the AND circuit 11 having a logical level reverse to the logical level of the signal A2, and the signal C2 goes to an "H" level. In this manner, the transistor QP2 is turned OFF, the transistor QN2 is turned ON, charging to the load capacitor not shown or a current flowing in inductance components such as a wire, a pattern on a printed board, and a bonding wire of an integrated circuit is temporarily interrupted.

Subsequently, a signal obtained by delaying the input signal Vin is output from the delay circuit 16. At the rising edge of the output signal of the delay circuit 16, the output signal A2 having an "L" level is written in the DF/F with SET 17, and the level of the output signal of the DF/F with SET 17 changes to an "L" level. Since the level of the output signal of the DF/F with SET 17 changes to the "L" level, the selector circuit 18 selects an input from the input terminal X51, i.e., a signal at the "L" level of the ground to output the signal. Since the output signal D2 of the selector circuit 18 goes to an "L" level, the signal B2 goes to an "L" level, and the selector circuit 13 selects the signal A2 to output the signal A2.

In this manner, the output signal C2 of the selector circuit 13 goes to an "L" level again, the transistor QP2 is turned ON, and the transistor QN2 is turned OFF. The load capacitor is charged, and the output signal Vout2 goes to an "H" level. More specifically, when the level of the input signal Vin changes from an "L" level to an "H" level, and the level of the output signal Vout2 begins to change to an "L" level. When the output signal Vout2 is equal to ½ VDD, the level of the signal C2 temporarily changes from an "L" level to an "H" level. The output signal Vout2 is suppressed from rising, the signal C2 goes to the "L" level, and the output signal Vout2 goes to the "H" level.

The period of time for which the output signal C2 is in the "H" level is dependent on the delay time obtained by the delay circuit 16. More specifically, the output signal Vout2 is suppressed from rising for only the delay time of the delay circuit 16. When the output signal Vout2 goes to the "H" level, the output signal of the AND circuit 19 goes to an "H" level, the output signal of the comparator 20 goes to an "H" level, and the output signal of the inverter circuit 21 goes to an "L" level. The DF/F with SET/RESET 24 is set in a SET state, and the level of the output signal of the DF/F with SET/RESET 24 changes to an "H" level. In this manner, the selector circuit 25 selects the output signal of the comparator 20 to output the signal, and the output signal E2 of the inverter circuit 26 goes to an "L" level.

In this manner, overshoot and ringing can be suppressed. In addition, since timing adjustment is performed by feeding back the output signal Vout2, appropriate timing adjustment depending upon the characteristics of the load is automatically performed. The reference potential of the comparator 15 for timing adjustment is not limited to ½ VDD. The reference potential may be another value at which overshoot and ringing can be suppressed.

In addition, when the input signal Vin falls, the level of the input signal Vin changes from an "H" level to an "L" level, and the levels of the output signal A2 and the signal C2 of the inverter circuit 12 change from "L" levels to "H" levels.

In this manner, the transistor QP2 is turned OFF, and the transistor QN2 is turned ON. Discharging of the load capacitor is started, and the level of the output signal Vout2 begins to change from the "H" level to the "L" level. Since the level of the signal A2 changes to the "H" level, the selector circuit 27 selects the output signal E2 of the inverter circuit 26.

When the output signal Vout2 is equal to or less than ½ VDD, the level of the output signal of the comparator 20 changes from an "H" level to an "L" level. For this reason, the level of the output signal of the selector circuit 25 also changes from an "H" level to an "L" level, and the levels of the signals E2 and B2 change from "L" levels to "H" levels. When the level of the signal B2 changes to an "H" level, the selector circuit 13 selects the output signal of the AND circuit 11 having a logical level reverse to the logical level of the signal A2, and the signal C2 goes to an "L" level. In this manner, the transistor QP2 is turned ON, the transistor QN2 is turned OFF, and charging to the load capacitor or a current flowing in inductance components such as a wire, a pattern on a printed board, and a bonding wire of an integrated circuit is temporarily interrupted.

Subsequently, a signal obtained by delaying the inverted signal of the signal C2 is output from the delay circuit 23. At the rising edge of the output signal of the delay circuit 23, the input signal Vin having an "L" level is written in the DF/F with SET/RESET 24, and the level of the output signal of the DF/F with SET/RESET 24 changes to an "L" level. Since the level of the output signal of the DF/F with SET/RESET 24 changes to the "L" level, the selector circuit 25 selects an input from the input terminal X61, i.e., a signal set at the "H" level of the power supply to output the signal. The levels of the signals E2 and B2 go to the "L" levels again, and the selector circuit 13 selects the signal A2 again to output the signal A2.

In this manner, the output signal C2 of the selector circuit 13 goes to an "H" level again, the transistor QP2 is turned OFF, and the transistor QN2 is turned ON. The load capacitor is set in a discharge state, and the output signal Vout2 goes to an "L" level. More specifically, when the level of the input signal Vin changes from an "H" level to an "L" level, and the level of the output signal Vout2 begins to change to an "L" level. When the output signal Vout2 is equal to ½ VDD, the level of the signal C2 temporarily changes from an "L" level to an "H" level. The output signal Vout2 is suppressed from falling, the signal C2 goes to the "L" level, and the output signal Vout2 goes to the "L" level.

The period of time for which the signal C2 is in the "H" level is dependent on the delay time obtained by the delay circuit 23. More specifically, the output signal Vout2 is suppressed from falling for only the delay time of the delay circuit 23. When the output signal Vout2 goes to the "L" level, the output signal of the AND circuit 14 goes to an "L" level, and the output signal of the comparator 15 goes to an "L" level. The DF/F with SET 17 is set in a SET state, and the level of the output signal of the DF/F with SET 17 changes to an "H" level. In this manner, the selector circuit 18 selects the output signal of the comparator 15 to output the signal, and the output signal D2 goes to an "L" level.

In this manner, undershoot and ringing can be suppressed. In addition, since timing adjustment is performed by feeding back the output signal Vout2, appropriate timing adjustment depending upon the characteristics of the load is automatically performed. The reference potential of the comparator 20 for timing adjustment is not limited to ½ VDD. The reference potential may be another value at which undershoot and ringing can be suppressed.

As described above, according to the second embodiment, immediately before the output signal Vout2 of the final CMOS output circuit is overshot, a voltage applied to the gate electrode of the final CMOS output circuit is temporarily increased to suppress the output signal vout2 from rising. Further, immediately before the output signal Vout2 of the final CMOS output circuit is undershot, the voltage applied to the gate electrode of the final CMOS output circuit is temporarily dropped to suppress the output signal Vout2 from falling. Therefore, overshoot, undershoot, and ringing of the output signal can be reduced to prevent an erroneous operation, and the drive capability of the output buffer circuit can be improved to increase a processing speed.

Further, the amounts of delay of the delay circuits 16 and 23 can be changed. When the amounts of delay of the delay circuits 16 and 23 are adjusted, the length of the period of time for which the voltage applied to the gate electrode of the output circuit is temporarily increased or dropped can be adjusted depending upon the characteristics (capacitance or the like) of the load connected to the output terminal of the output buffer circuit. In addition, when the value of the output signal Vout2 is monitored by the comparators 15 and 20, appropriate timing setting depending upon the load can be automatically performed. In this manner, since an output buffer circuit need not be prepared for each of the characteristics of the load, and the timing need not be set in consideration of the characteristics of the load, costs can be reduced. A delay time obtained by the combination circuit constituted by the AND circuit 11, the selector circuit 13, and the selector control circuit 81 for reducing overshoot, undershoot, and ringing is sufficiently short. The delay time is appropriate to a high-speed operation of the output buffer circuit.

Figure 11:
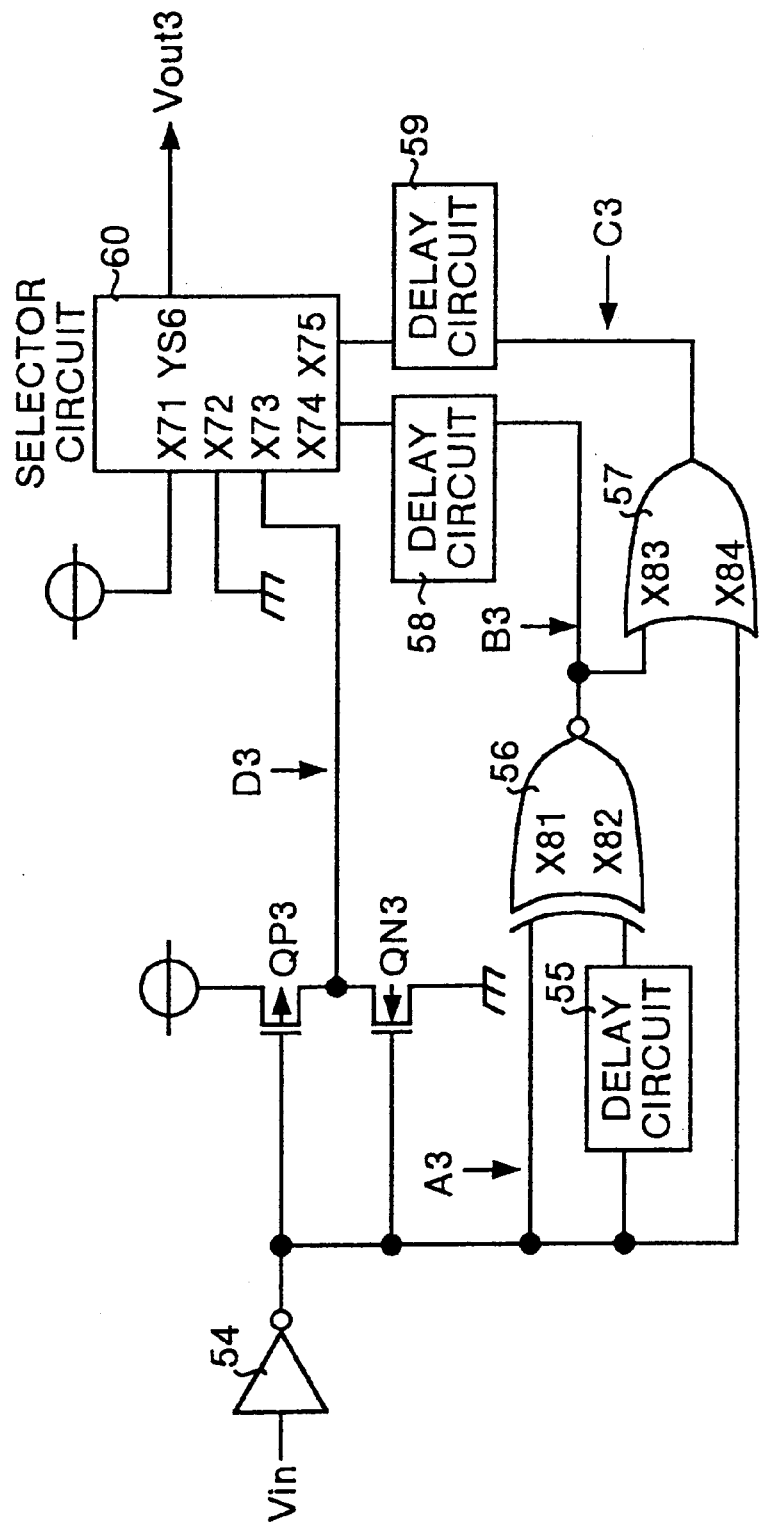
FIG. 11 is a circuit diagram showing the rough configuration of an output buffer circuit according to a third embodiment of the present invention.

FIG. 11 is a circuit diagram showing the rough configuration of an output buffer circuit according to a third embodiment of the present invention. The output buffer circuit according to the third embodiment comprises an inverter circuit 54 which receives an input signal Vin from the outside of the output buffer circuit and outputs an inverted signal, a final CMOS output circuit using an output signal A3 of the inverter circuit 54 as a gate input, a delay circuit 55 which receives the output signal A3 and outputs a delayed signal, an EXNOR circuit 56 which receives the output signal A3 and an output signal of the delay circuit 55 and performs an operation of exclusive NOR, an OR circuit 57 which receives the output signal A3 and an output signal B3 of the EXNOR circuit 56 performs an operation of logical OR, a delay circuit 58 which receives the signal B3, a delay circuit 59 which receives an output signal C3 of the OR circuit 57 and delays the output signal C3, and a selector circuit 60.

The selector circuit 60 has an input terminal X71 connected to a power supply and a grounded input terminal X72, receives an output signal D3 of the final CMOS output circuit from an input terminal X73, receives an output signal of the delay circuit 58 from an input terminal X74, receives an output signal of the delay circuit 59 from an input terminal X75, and performs selection depending upon the logical levels of the output signals of the delay circuits 58 and 59. The final CMOS output circuit is constituted by a p-channel MOS transistor QP3 and an n-channel MOS transistor QN3 which are arranged in series with each other between the power supply and the ground and have high drive capabilities, and the signal D3 is output from the node between the transistor QP3 and the transistor QN3.

When the logical level of the input signal Vin does not change, the logical level of the signal A3 does not change too, and the logical level of the output signal of the delay circuit 55 does not change too. Thus, the logical level of the signal A3 and the logical level of the output signal of the delay circuit 55 are equal to each other, and the EXNOR circuit 56 outputs a signal at an "H" level. On the other hand, when the logical level of the input signal Vin changes, the logical level of the output signal A3 also changes, and the logical level of the output signal of the delay circuit 55 also changes a predetermined period of delay time after.

In a period of time after the logical level of the output signal A3 changes until a delay time obtained by the delay circuit 55 elapses, the logical level of the output signal A3 and the logical level of the output signal of the delay circuit 55 are different from each other. Accordingly, the EXNOR circuit 56 outputs a signal at an "L" level. More specifically, the logical level of the input signal Vin changes, the EXNOR circuit 56 outputs a pulse signal whose logical level changes in the order named: "H", "L", and "H" levels. When the signal A3 is at an "L" level, and this pulse signal is output from the EXNOR circuit 56, like the EXNOR circuit 56, the OR circuit 57 outputs a pulse signal whose logical level changes in the order named: "H", "L", and "H" levels. The pulse signals output from the EXNOR circuit 56 and the OR circuit 57 are delayed by the delay circuits 58 and 59, and the delayed pulse signals are input to the selector circuit 60.

Figure 12:
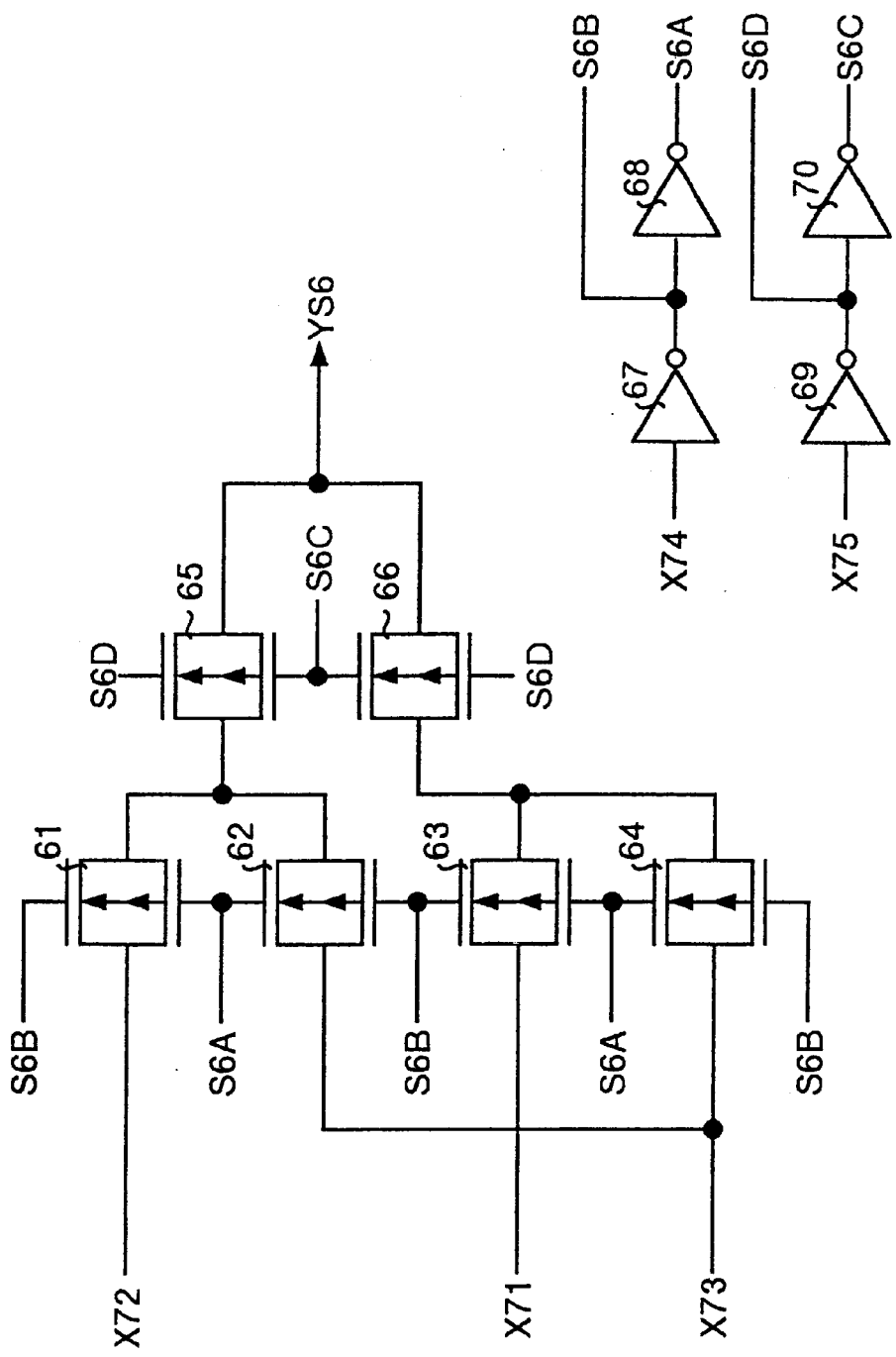
FIG. 12 is a circuit diagram showing the configuration of a selector circuit according to the third embodiment shown in FIG. 11.

FIG. 12 is a circuit diagram showing the configuration of the selector circuit 60 shown in FIG. 11. The selector circuit 60 comprises inverter circuits 67, 68, 69, and 70 and switches 61, 62, 63, 64, 65, and 66. The inverter circuits 67 and 68 output a signal S6A having a logical level equal to that of an output signal of the delay circuit 58 and input from an input terminal X74 and a signal S6B having a logical level reverse to that of the output signal and input from the input terminal X74, respectively. The inverter circuits 69 and 70 output a signal S6C having a logical level equal to that of an output signal of the delay circuit 59 input from the input terminal X75 and a signal S6D having a logical level reverse to the logical level of the output signal.

The switches 61 and 66 are turned ON or OFF depending upon the logical levels of the signals S6A to S6D to connect one of the input terminals X71, X72, and X73 to an output terminal YS6. In this manner, when the output signals of the delay circuit 58 and the delay circuit 59 are at "H" levels, the input terminal X73 is selected to output the signal D3. The output signals of the delay circuit 58 and the delay circuit 59 are at "L" levels, the input terminal X72 is selected to connect the ground to the output terminal YS6. When the output signal of the delay circuit 58 is at the "L" level, and the output signal of the delay circuit 59 is at the "H" level, the input terminal X71 is selected to connect the power supply to the output terminal YS6.

Each of the delay circuits 55, 58, and 59 has the same onfiguration as that of the delay circuit according to the first embodiment shown in FIG. 3, and has a variable amount of delay. The first CMOS output circuit constituted by the p-channel MOS transistor QP3 and the n-channel MOS transistor QN3 corresponds to the output unit according to the present invention, and the combination circuit constituted by the delay circuit 55, the EXNOR circuit 56, the OR circuit 57, the delay circuits 58 and 59, and the selector circuit 60 corresponds to the correction unit according to the present invention. The delay circuit 55 corresponds to the second adjustment unit according to the present invention, and the delay circuits 58 and 59 correspond to the first adjustment unit according to the present invention.

Figure 13:
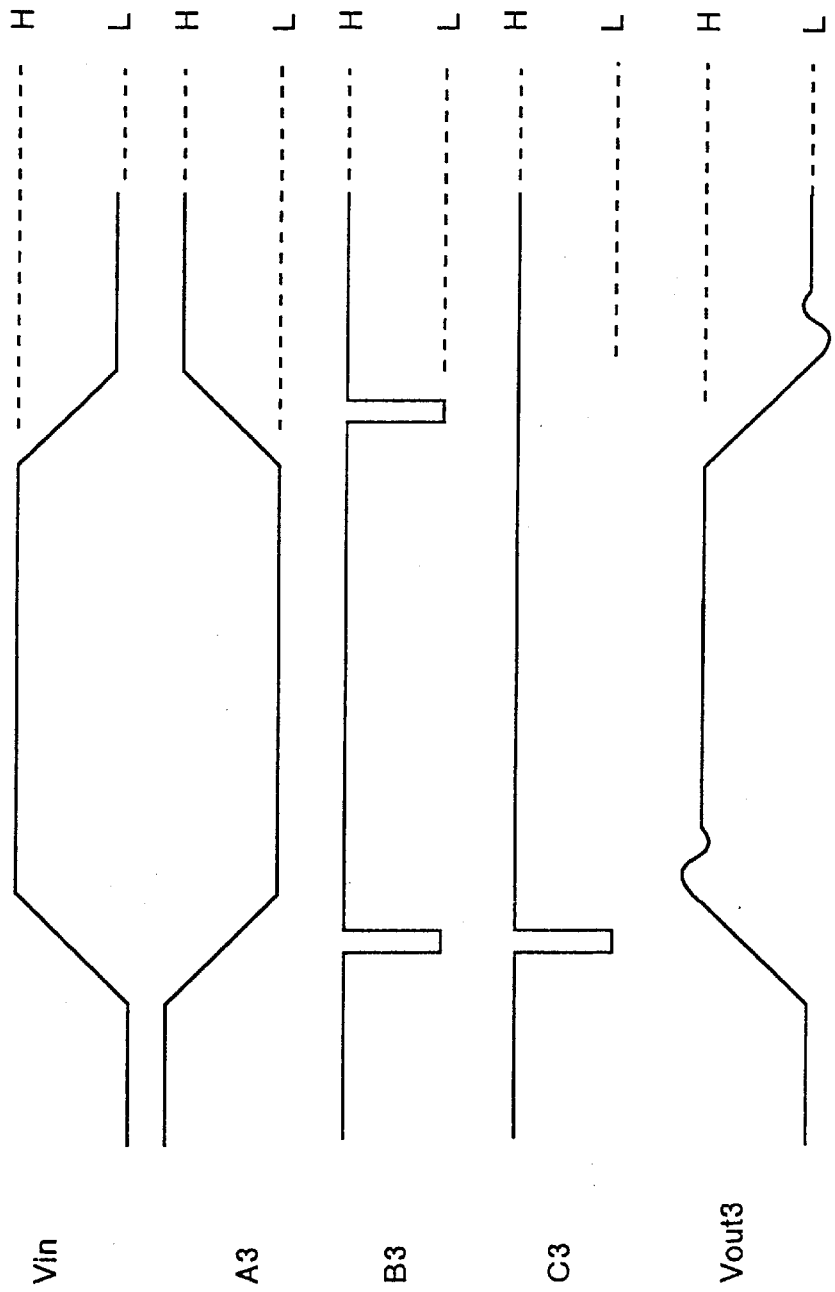
FIG. 13 is a timing chart showing an operation of the output buffer circuit according to the third embodiment.
Figure 14:
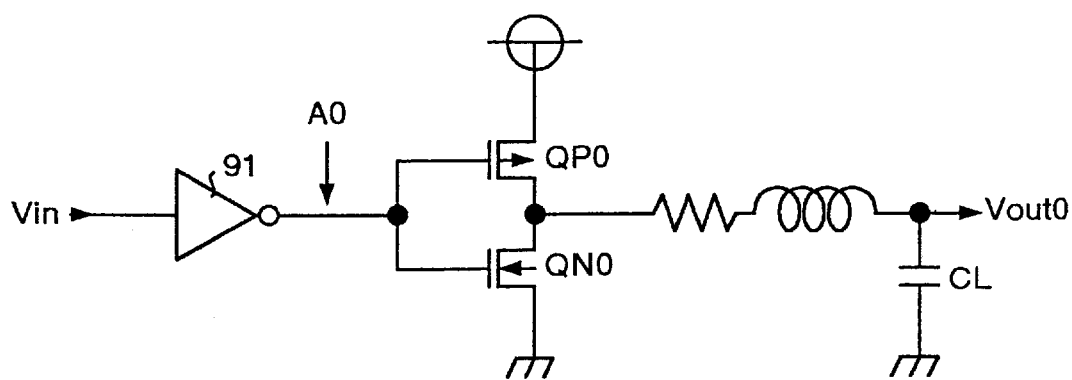
FIG. 14 is a circuit diagram showing a rough configuration of a conventional output buffer circuit.
Figure 15:
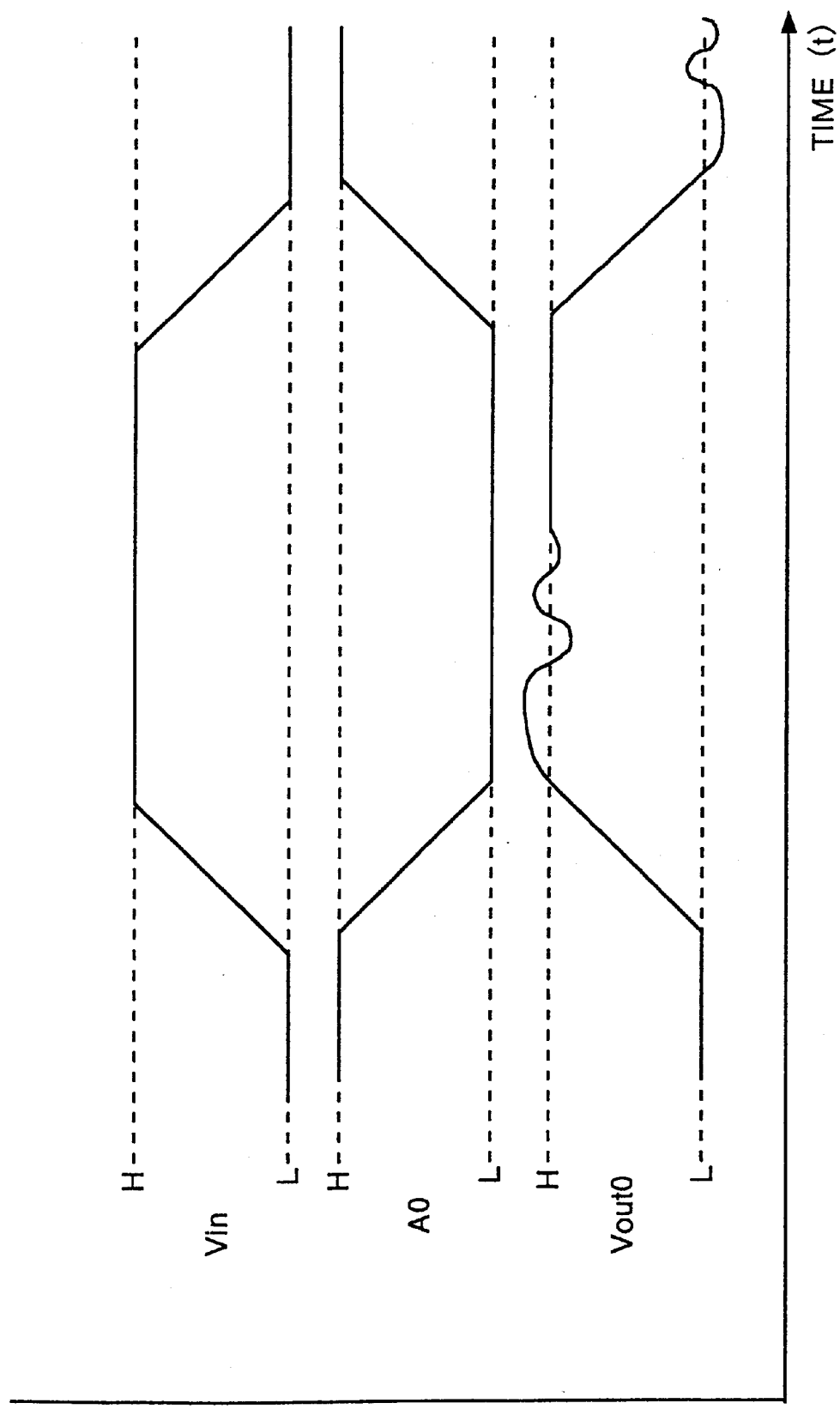
FIG. 15 is a timing chart showing an operation of the conventional output buffer circuit.
Figure 16:
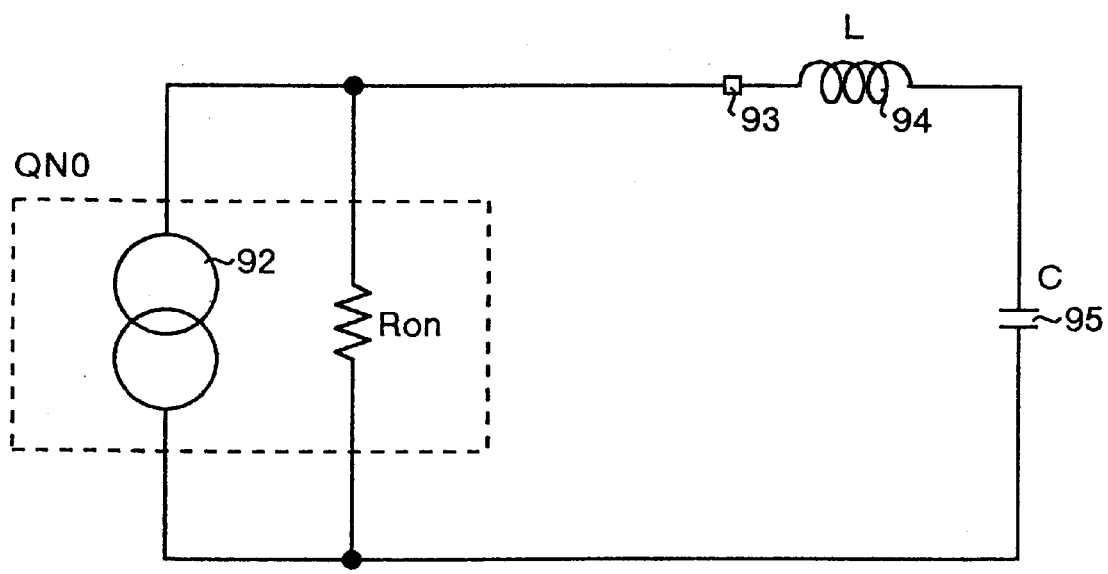
FIG. 16 is a circuit diagram showing a rough equivalent circuit of the conventional output buffer circuit.

Operation of the third embodiment will be described below with reference to a timing chart. FIG. 13 is a timing chart showing the operation of the output buffer circuit according to the third embodiment. In the operation of the output buffer circuit according to the third embodiment, when the input signal Vin is stable at an "L" level for a sufficient time equal to or longer than a time obtained by adding the delay time obtained by the delay circuit 55 to the delay times obtained by the delay circuits 58 and 59, the output signal A3 of the inverter circuit 54 goes to an "H" level, the output signal B3 of the EXNOR circuit 56 goes to an "H" level, and the output signals of the delay ircuits 58 and 59 also go to "H" levels.

Since the signal A3 is at the "H" level, the transistor QP3 is turned OFF, and the transistor QN3 is turned ON. Since the output signals of the delay circuits 58 and 59 are at the "H" levels, the selector circuit 60 selects the signal D3. In this manner, a not shown load capacitor connected to the output terminal of the selector circuit 60, i.e., the output terminal of the output buffer circuit is in a discharge state, and the output signal of the selector circuit 60, i.e., an output signal Vout3 of the output buffer circuit goes to an "L" level.

When the input signal Vin rises, i.e., when the level of the input signal Vin changes from an "L" level to an "H" level, the level of the output signal A3 of the inverter circuit 54 changes from an "H" level to an "L" level. As described above, the pulse signals whose logical levels change in the order named: "H", "L", and "H" levels is output from the EXNOR circuit 56 and the OR circuit 57, delayed by the delay circuits 58 and 59, and then input to the selector circuit 60. The selector circuit 60 selects and outputs the output signal D3. However, the ground and the output terminal YS6 are connected to each other for only the period of time for which the pulse signals input from the input terminal X74 and the input terminal X75 are kept at "H" levels. More specifically, the output signal Vout3 of the selector circuit 60 is switched in the order named: "signal D3", "ground", and "signal D3".

When the selector circuit 60 selects the signal D3 before the ground is selected, the signal A3 goes to an "L" level to turn ON the transistor QP3 and to turn OFF the transistor QN3. Charging to the load capacitor is started, and the level of the output signal Vout3 rises. After delay operations performed by the delay circuits 58 and 59, a pulse signal input to the selector circuit 60 goes to an "L" level, and the selector circuit 60 selects the ground. In this manner, charging to the load capacitor or a current flowing in inductance components such as a wire, a pattern on a printed board, and a bonding wire of an integrated circuit is temporarily interrupted.

This interruption continues in the period of time for which the pulse signal input to the selector circuit 60 is kept at the "L" level, i.e., for a delay time obtained by the delay circuit 55. In this manner, overshoot and ringing can be suppressed. After the delay time obtained by the delay circuit 55 elapses, the pulse signal input to the selector circuit 60 goes to the "H" level again. When the selector circuit 60 selects the signal D3 again, the load capacitor (not shown) is charged, and the output signal Vout3 goes to an "H" level.

In addition, when the input signal Vin falls, i.e., when the level of the input signal Vin changes from an "H" level to an "L" level, the level of the output signal A3 of the inverter circuit 54 changes from an "L" level to and an "H" level. As described above, the pulse signal whose logical level changes in the order named: "H", "L", and "H" levels is output from the EXNOR circuit 56, delayed by the delay circuit 58, and then input to the selector circuit 60. The selector circuit 60 selects and outputs the signal D3.

However, the power supply and the output terminal YS6 are connected to each other for only the period of time for which the pulse signal input from the input terminal X74 is kept at an "L" level. More specifically, the output signal Vout3 of the selector circuit 60 is switched in the order named: "signal D3", "power supply", and "signal D3".

When the selector circuit 60 selects the signal D3 before the power source is selected, the signal A3 goes to an "H" level to turn OFF the transistor QP3 and to turn ON the transistor QN3. Discharging of electric charges charged in the load capacitor is started, and the level of the output signal Vout3 falls. After a delay operation performed by the delay circuit 58, a pulse signal output from the delay circuit 58 to the selector circuit 60 goes to an "L" level, and the selector circuit 60 selects the power supply. In this manner, charging to the load capacitor or a current flowing in inductance components such as a wire, a pattern on a printed board, and a bonding wire of an integrated circuit is temporarily interrupted.

This interruption continues in the period of time for which the pulse signal output from the delay circuit 58 to the selector circuit 60 is kept at the "L" level, i.e., for a delay time obtained by the delay circuit 55. In this manner, undershoot and ringing can be suppressed. After the delay time obtained by the delay circuit 55 elapses, the pulse signal output from the delay circuit 58 to the selector circuit 60 goes to the "H" level again. When the selector circuit 60 selects the output signal D3 again, the load capacitor (not shown) is in a discharge state, and the output signal Vout3 goes to an "L" level.

As described above, according to the third embodiment, immediately before the output signal Vout3 is overshot, the output terminal is temporarily grounded, and the output signal is suppressed from rising. Further, immediately before the output signal Vout3 is undershot, the output terminal is temporarily connected to the power supply, and the output signal is suppressed from falling. Therefore, overshoot, undershoot, and ringing of the output signal can be reduced to prevent an erroneous operation, and the drive capability of the output buffer circuit can be improved to increase a processing speed.

Further, the amounts of delay of the delay circuits 55, 58, and 59 can be changed. When the amounts of delay of the delay circuits 55, 58, and 59 are adjusted, the timing at which the voltage applied to the gate electrode of the output circuit is temporarily increased or dropped and the length of the period of time for which the voltage is temporarily increased or dropped can be adjusted depending upon the characteristics (capacitance or the like) of the load connected to the output terminal of the output buffer circuit. Thus, an output buffer circuit need not be prepared for each of the characteristics of the load, and costs can be reduced. A delay time obtained by the combination circuit constituted by the delay circuit 55, the EXNOR circuit 56, the OR circuit 57, the delay circuits 58 and 59, and the selector circuit 60 for reducing overshoot, undershoot, and ringing is sufficiently short. The delay time is appropriate to a high-speed operation of the output buffer circuit.

As has been described above, according to a first aspect of the present invention, when a signal output to the output unit rises from a relatively low first potential level ("L" level) to a relatively high second potential level ("H" level), the correction unit temporarily decreases the signal. When the signal falls from the relatively high second potential level to the relatively low first potential level, the correction unit temporarily raises the signal. In this manner, when the output signal rises, immediately before overshoot occurs, a voltage applied to the gate of the output unit is dropped, and the output signal can be suppressed from falling. Accordingly, the following advantages can be achieved. That is, overshoot, undershoot, and ringing can be reduced to prevent an erroneous operation, and the drive capability can be improved to increase a processing speed.

According to a second aspect of the present invention, the correction unit temporarily gives a reverse bias to suppress an output signal of the output buffer circuit from rising when a signal output by the output unit rises from a relatively low first potential level to a relatively high second potential level, and temporarily gives a reverse bias to suppress the output signal of the output buffer circuit from falling when the signal output by the output unit falls from the relatively high second potential level to the relatively low first potential level. In this manner, when the output signal rises, the output signal can be temporarily suppressed from rising immediately before overshoot occurs. When the output signal falls, the output signal can be temporarily suppressed from falling immediately before undershoot occurs. Accordingly, the following advantages can be achieved. That is, overshoot, undershoot, and ringing can be reduced to prevent an erroneous operation, and the drive capability can be improved to increase a processing speed.

The timing at which a signal output by the output unit is temporarily decreased or raised or a timing at which an output signal of the output buffer circuit is suppressed from rising or falling is adjusted by the first adjustment unit, and at an appropriate timing depending upon the characteristics of a load to be connected, the signal output by the output unit is temporarily decreased or raised, or the output signal of the output buffer circuit can be suppressed from rising or falling. Accordingly, the following advantages can be achieved. That is, different output buffer circuits need not be prepared for the characteristics of the load to be connected, respectively, and costs can be reduced.

According to a third aspect of the present invention, the correction unit temporarily raises or decreases a signal output by the output unit at the timing depending upon rising or falling of the output signal of the output unit. In this manner, when the output signal rises, a voltage applied to the gate of the output unit is temporarily increased immediately before overshoot occurs and hence the output signal can be suppressed from rising. When the output signal falls, the voltage applied to the gate of the output unit is temporarily dropped immediately before undershoot occurs and hence the output signal can be suppressed from falling. Accordingly, the following advantages can be achieved. That is, overshoot, undershoot, and ringing can be reduced to prevent an erroneous operation, and the drive capability can be improved to increase a processing speed. In addition, without setting the timing, the signal can be temporarily fallen or raised at an appropriate timing depending upon the characteristics of the load to be connected. Accordingly, the following advantages can be achieved. That is, the timing need not be set, different output buffer circuits need not be prepared for the characteristics of the load to be connected, respectively, and costs can be reduced.

The length of the period of time for which a signal output by the output unit is temporarily decreased or raised or the length of the period of time for which the output signal of the output buffer circuit is suppressed from rising or falling is adjusted by the second adjustment unit, so that the signal can be temporarily kept fallen or raised for an appropriate time depending upon the characteristics of a load to be connected. Accordingly, the following advantages can be achieved.

That is, different output buffer circuits need not be prepared for the respective characteristics of the load to be connected, and costs can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An output buffer circuit comprising:

an input terminal;

an inverter having an input connected to the input terminal;

an output unit having a CMOS configuration; and a correction unit, arranged between a said input terminal and said output unit, for temporarily decreasing a signal output to said output unit when an input signal at said input terminal rises from a relatively low first potential level to a relatively high second potential level and for temporarily raising the signal output to said output unit when the input signal at said input terminal falls from the relatively high second potential level to the relatively low first potential level, said correction unit including a selector circuit having a first input connected to said input terminal, a second input connected to an output of said inverter, an output terminal connected to an input of said output unit, and a control terminal receiving a control signal for controlling a signal output by said selector circuit at the output of said selector circuit;

an exclusive OR circuit connected at a first input to the output of said inverter, a first delay circuit receiving a signal output by said exclusive OR circuit and connected at an output to the control terminal of said selector circuit; and a second delay circuit connected between the output of said inverter and a second input of said exclusive OR circuit.

2. The output buffer circuit according to claim 1, wherein said first delay circuit has a variable delay for adjusting timing at which the signal output to said output unit is temporarily decreased or increased.

3. The output buffer circuit according to claim 1, wherein said second delay has a variable delay for adjusting how long the signal output to said output unit is temporarily decreased or increased.

4. An output buffer circuit comprising:

an output terminal;

an output unit having a CMOS configuration;

an inverter having an input receiving the input signal of said output buffer circuit and an output connected to said output unit; and a correction unit, arranged between said output terminal of the output buffer circuit and said output unit, for temporarily applying a reverse bias to suppress rising of an output signal at said output terminal when a signal output by said output unit rises from a relatively low first potential level to a relatively high second potential level, and for temporarily applying a reverse bias to suppress falling of the output signal at said output terminal when the signal output by said output unit falls from the relatively high second potential level to the relatively low first potential level, said correction unit including a selector circuit including said output terminal, a first input receiving a power supply voltage, a second input connected to ground, a third input connected to an output of said output unit, and first and second control terminals receiving control signals for controlling the signal output at said output terminal;

an exclusive NOR circuit having a first input connected to the output of said inverter;

a first delay circuit receiving an output from said exclusive NOR circuit and providing an output signal to the first control terminal of said selector circuit;

an OR circuit having a first input connected to the output of said exclusive NOR circuit and a second input connected to the output of said inverter;

a second delay circuit connected between an output of said OR circuit and the second control terminal of said selector circuit; and a third delay circuit connected between the output of said inverter and a second input of said exclusive NOR circuit.

5. The output buffer circuit according to claim 4, wherein said first and second delay circuits have variable delays for adjusting timing at which a change in the signal output to said output buffer circuit is suppressed.

6. The output buffer circuit according to claim 4, wherein said third delay circuit has a variable delay for adjusting how long a change in the signal output to said output buffer circuit is suppressed.

7. An output buffer circuit comprising:

an output unit having a CMOS configuration;

an inverter receiving an input signal of said output buffer circuit; and a correction unit for temporarily raising or decreasing a signal output by said output unit at a time depending upon rising or falling of the output signal of said output unit, said correction unit including a selector circuit having a first input receiving the input signal of said output buffer circuit, a second input receiving a signal from an output of said inverter, an output supplying a signal to said output unit, and a control terminal receiving a control signal for controlling the signal output from said selector circuit to said output unit; and a selector control circuit connected to the control terminal of said selector circuit for controlling the output signal supplied to said output unit.

8. The output buffer circuit according to claim 7, wherein said correction unit has an adjustment unit for adjusting how long the signal output by said output unit is temporarily decreased or increased, or how long a change in the signal output by said output unit is suppressed.

9. The output buffer circuit according to claim 7, wherein said correction unit includes an AND circuit receiving the signal input to said output buffer circuit at a first input and receiving a reset signal at a second input, an output of said AND circuit being supplied to the input of said inverter and to the first input of said selector circuit.

10. An output buffer comprising:

an input terminal through which a signal is input;

an inverter which inverts a signal input through said input terminal to produce an inverted signal;

an output unit having a CMOS configuration and which outputs an output signal based on one of the signal input through said input terminal and the inverted signal;

a output terminal through which the output signal is output; and a correction unit which selects one of the signal input and the inverted signal supplied to said output unit based on a potential level of the signal input, said correction unit including:
- a potential level detection unit which detects the potential level of the signal input and determines whether the potential level of the signal input is constant; and
- a signal selection unit which, based on the potential level of the signal input detected by said potential level detection unit,
  - makes said correction unit select the signal input as the signal supplied to said output unit, if the potential level of the signal input is constant; and
  - makes said correction unit select the inverted signal, select the signal input only for a time period, and, thereafter, again select the inverted signal, as the signal supplied to said output unit, if the potential level of the input signal is not constant.

11. The output buffer according to claim 10, wherein said correction unit includes a timing adjusting unit which, when selecting the signal input as the signal supplied to said output unit, adjusts timing at which the signal input is selected.

12. The output buffer according to claim 11, including a load connected to said output terminal, wherein said timing adjusting unit adjusts the timing at which the signal input is selected based on characteristics of said load.

13. The output buffer according to claim 10, wherein said correction unit includes a duration adjusting unit which, when selecting the signal input as the signal supplied to said output unit, adjusts duration of the time period for which the signal input is selected.

14. The output buffer according to claim 13, including a load connected to said output terminal, wherein said duration adjusting unit adjusts timing at which the signal input is selected based on characteristics of said load.

15. The output buffer according to claim 10, wherein said potential level detection unit includes:
- a delay circuit having an input terminal and an output terminal, the input terminal being connected to an output of said inverter; and
- an exclusive OR circuit having first and second input terminals and an output terminal, the first input terminal being connected to the output of said inverter, the second input terminal being connected to the output terminal of said delay circuit, and said signal selection unit includes:
- a second delay circuit having an input terminal and an output terminal, the input terminal being connected to the output terminal of said exclusive OR circuit; and
- a selector circuit having first and second input terminals, a control terminal, and an output terminal, the first input terminal receiving the input signal, the second input terminal receiving the inverted signal, the control terminal being connected to the output terminal of said second delay circuit, and the output terminal being connected to said output unit.

16. An output buffer comprising:
an input terminal through which a signal is input;
an inverter which inverts a signal input through said input terminal to produce an inverted signal;
an output unit having a CMOS configuration and which outputs an output signal based on the inverted signal;
a power unit which generates an electric potential;
a ground unit at an electric potential less than the electric potential generated by said power unit; and
a correction unit which selects a signal output through an output terminal based on potential level of the signal input, said correction unit including:
- a potential level detection unit which detects the potential level of the signal input and determines whether the potential level of the signal input is constant, the potential level of the signal input has increased from a first potential level to a second potential level higher than the first potential level, or the potential level of the signal input has decreased from the second potential level to the first potential level; and
- a signal selection unit which, based on the potential level of the signal input detected by said potential level detection unit,
  - makes said correction unit select the output signal as the signal output through said output terminal, if the potential level of the signal input is constant;
  - makes said correction unit select the output signal, select the electric potential of said ground unit only for a time period, and, thereafter, again select the output signal, as the signal output through said output terminal, if the potential level of the signal input has increased from the first potential level to the second potential level; and
  - makes said correction unit select the output signal, select the electric potential generated by said power unit only for a time period, and, thereafter, again select the output signal, as the signal output through said output terminal, if the potential level of the signal input has decreased from the second potential level to the first potential level.

17. The output buffer according to claim 16, wherein said correction unit includes a timing adjusting unit which, when selecting each of the electric potential of said ground unit and the electric potential generated by said power unit as a signal output through said output terminal, adjusts timing at which the potential is selected.

18. The output buffer according to claim 17, including a load connected to said output terminal, wherein said timing adjusting unit adjusts the timing at which the potential is selected based on characteristics of said load.

19. The output buffer according to claim 16, wherein said correction unit includes a duration adjusting unit which, when selecting each of the electric potential of said ground unit and the electric potential generated by said power unit as a signal output through said output terminal, adjusts duration of the time period for which the potential is selected.

20. The output buffer according to claim 17, including a load connected to said output terminal, wherein said duration adjusting unit adjusts timing at which the potential is selected based on characteristics of said load.

21. The output buffer according to claim 16, wherein said potential level detection unit includes:
a first delay circuit having an input terminal and an output terminal, the input terminal being connected to an output of said inverter;
an exclusive OR circuit having first and second input terminals and an output terminal, the first input terminal being connected to the output of said inverter and the second input terminal being connected to the output terminal of said first delay circuit; and
an OR circuit having first and second input terminals and an output terminal, the first input terminal being connected to the output of said exclusive OR circuit, the second input terminal being connected to the output of said inverter; and said signal selection unit includes:
- a third delay circuit having an input terminal and an output terminal, the input terminal being connected to the output terminal of said exclusive OR circuit;
- a fourth delay circuit having an input terminal and an output terminal, the input terminal being connected to the output terminal of said OR circuit, and
- a selector circuit having first, second, and third input terminals, first and second control terminals, and an output terminal, the first input terminal receiving the electric potential generated by said power unit, the second input terminal receiving the electric potential of said ground unit, the third input terminal receiving the output signal output by said output unit, the first control terminal being connected to the output terminal of said third delay circuit, the second control terminal being connected to the output terminal of said fourth delay circuit, and the output terminal being connected to said output terminal.

22. An output buffer comprising:

a input terminal through which a signal is input;

an inverter which inverts a signal input through said input terminal to produce an inverted signal;

an output unit having a CMOS configuration and which outputs an output signal based on one of the signal input through said input terminal and the inverted signal;

a output terminal through which an output signal is output; and a correction unit which selects a signal to be supplied to said output unit based on potential level of the output signal, said correction unit including:
- a potential level detection unit which detects the potential level of the output signal and determines whether the potential level of the output signal is constant, the potential level of the output signal has increased from a first potential level to a second potential level higher than the first potential level, or the potential level of the output signal has decreased from the second potential level to the first potential level; and
- a signal selection unit which, based on the result of detection of the potential level of the output signal by said potential level detection unit,
    - makes said correction unit select the inverted signal as the signal supplied to said output unit, if the potential level of the output signal is constant; and
    - makes said correction unit select the inverted signal, select the input signal only for a time period, and, thereafter, again select the inverted signal, as the signal supplied to said output unit, if the potential level of the output signal has increased from the first potential level to the second potential level, or if the potential level of the input signal has decreased from the second potential level to the first potential level.

23. The output buffer according to claim 22, wherein said correction unit includes a timing adjusting unit which, when selecting the signal input as the signal supplied to said output unit, adjusts timing at which the signal input is selected.

24. The output buffer according to claim 23, including a load connected to said output terminal, wherein said timing adjusting unit adjusts the timing at which the signal input is selected based on characteristics of said load.

25. The output buffer according to claim 22, wherein said correction unit includes a duration adjusting unit which, when selecting the signal input as the signal supplied to said output unit, adjusts duration of the time period for which the signal input is selected.

26. The output buffer according to claim 25, including a load connected to said output terminal, wherein said duration adjusting unit adjusts timing at which the signal input is selected based on characteristics of said load.

* * * * *